(12) United States Patent
Anderson et al.

(10) Patent No.: US 9,640,638 B2
(45) Date of Patent: May 2, 2017

(54) SEMICONDUCTOR DEVICE AND METHOD OF FORMING A POWER MOSFET WITH INTERCONNECT STRUCTURE TO ACHIEVE LOWER RDSON

(71) Applicant: Great Wall Semiconductor Corporation, Tempe, AZ (US)

(72) Inventors: Samuel J. Anderson, Tempe, AZ (US); David N. Okada, Chandler, AZ (US); Patrick M. Shea, Oviedo, FL (US)

(73) Assignee: GREAT WALL SEMICONDUCTOR CORPORATION, Tempe, AZ (US)

( * ) Notice: Subject to any disclaimer, the term of this patent is extended or adjusted under 35 U.S.C. 154(b) by 185 days.

(21) Appl. No.: 13/746,826

(22) Filed: Jan. 22, 2013

(65) Prior Publication Data

US 2013/0134598 A1 May 30, 2013

Related U.S. Application Data

(63) Continuation-in-part of application No. 12/467,157, filed on May 15, 2009, now Pat. No. 8,921,186.
(Continued)

(51) Int. Cl.
*H01L 21/4763* (2006.01)
*H01L 29/66* (2006.01)
(Continued)

(52) U.S. Cl.
CPC ...... *H01L 29/66681* (2013.01); *H01L 21/768* (2013.01); *H01L 23/48* (2013.01); *H01L 23/4824* (2013.01); *H01L 29/1095* (2013.01); *H01L 29/66659* (2013.01); *H01L 29/7824* (2013.01); *H01L 29/7835* (2013.01); *H01L 23/562* (2013.01); *H01L 24/05* (2013.01); *H01L 24/13* (2013.01); *H01L 29/0653* (2013.01); *H01L 29/0847* (2013.01); *H01L 29/0878* (2013.01); *H01L 29/1083* (2013.01);
(Continued)

(58) Field of Classification Search
None
See application file for complete search history.

(56) References Cited

U.S. PATENT DOCUMENTS 4,772,935 A * 9/1988 Lawler et al. ............... 257/751
5,132,753 A 7/1992 Chang et al.
(Continued)

*Primary Examiner* — Reema Patel
(74) *Attorney, Agent, or Firm* — Foley & Lardner LLP; Mark J. Danielson

(57) ABSTRACT

A semiconductor device has a substrate and gate structure over the substrate. A source region is formed in the substrate adjacent to the gate structure. A drain region in the substrate adjacent to the gate structure opposite the source region. An interconnect structure is formed over the substrate by forming a conductive plane electrically connected to the source region, and forming a conductive layer within openings of the conductive plane and electrically connected to the drain region. The interconnect structure can be formed as stacked conductive layers laid out in alternating strips. The conductive plane extends under a gate terminal of the semiconductor device. An insulating layer is formed over the substrate and a field plate is formed in the insulating layer. The field plate is electrically connected the source terminal. A stress relief layer is formed over a surface of the substrate opposite the gate structure.

25 Claims, 37 Drawing Sheets

Related U.S. Application Data

(60) Provisional application No. 61/602,555, filed on Feb. 23, 2012, provisional application No. 61/053,566, filed on May 15, 2008.

(51) Int. Cl.
  | | |
  |---|---|
  | *H01L 21/768* | (2006.01) |
  | *H01L 23/48* | (2006.01) |
  | *H01L 29/78* | (2006.01) |
  | *H01L 23/482* | (2006.01) |
  | *H01L 29/40* | (2006.01) |
  | *H01L 29/417* | (2006.01) |
  | *H01L 29/423* | (2006.01) |
  | *H01L 29/06* | (2006.01) |
  | *H01L 29/08* | (2006.01) |
  | *H01L 29/10* | (2006.01) |
  | *H01L 23/00* | (2006.01) |

(52) U.S. Cl.
 CPC ........ *H01L 29/1087* (2013.01); *H01L 29/402* (2013.01); *H01L 29/41775* (2013.01); *H01L 29/42368* (2013.01); *H01L 2224/0401* (2013.01); *H01L 2224/05027* (2013.01); *H01L 2224/05155* (2013.01); *H01L 2224/05558* (2013.01); *H01L 2224/05562* (2013.01); *H01L 2224/05572* (2013.01); *H01L 2224/05573* (2013.01); *H01L 2224/05644* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2924/00014* (2013.01); *H01L 2924/01078* (2013.01); *H01L 2924/01079* (2013.01); *H01L 2924/01322* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10335* (2013.01); *H01L 2924/12041* (2013.01); *H01L 2924/12042* (2013.01); *H01L 2924/13091* (2013.01); *H01L 2924/19041* (2013.01); *H01L 2924/19042* (2013.01); *H01L 2924/19043* (2013.01); *H01L 2924/30105* (2013.01); *H01L 2924/30107* (2013.01); *H01L 2924/3511* (2013.01)

(56) References Cited

U.S. PATENT DOCUMENTS

| | | | |
|---|---|---|---|
| 6,090,700 A * | 7/2000 | Tseng | 438/624 |
| 6,693,340 B1 | 2/2004 | Amaratunga et al. | |
| 7,067,877 B2 * | 6/2006 | Nagaoka | 257/335 |
| 7,238,986 B2 | 7/2007 | Pendharkar et al. | |
| 7,511,319 B2 | 3/2009 | Zhu et al. | |
| 7,560,379 B2 * | 7/2009 | Kohli et al. | 438/630 |
| 7,821,033 B2 | 10/2010 | Sedlmaier et al. | |
| 2004/0245523 A1 * | 12/2004 | Jen | H01L 29/41733 257/59 |
| 2005/0269635 A1 * | 12/2005 | Bojarczuk et al. | 257/338 |
| 2006/0255401 A1 | 11/2006 | Yang et al. | |
| 2007/0085204 A1 | 4/2007 | Korec et al. | |
| 2007/0200184 A1 | 8/2007 | Zhu et al. | |
| 2008/0035994 A1 | 2/2008 | Jang | |
| 2008/0157365 A1 * | 7/2008 | Ott et al. | 257/750 |
| 2010/0207233 A1 | 8/2010 | Gambino et al. | |

\* cited by examiner

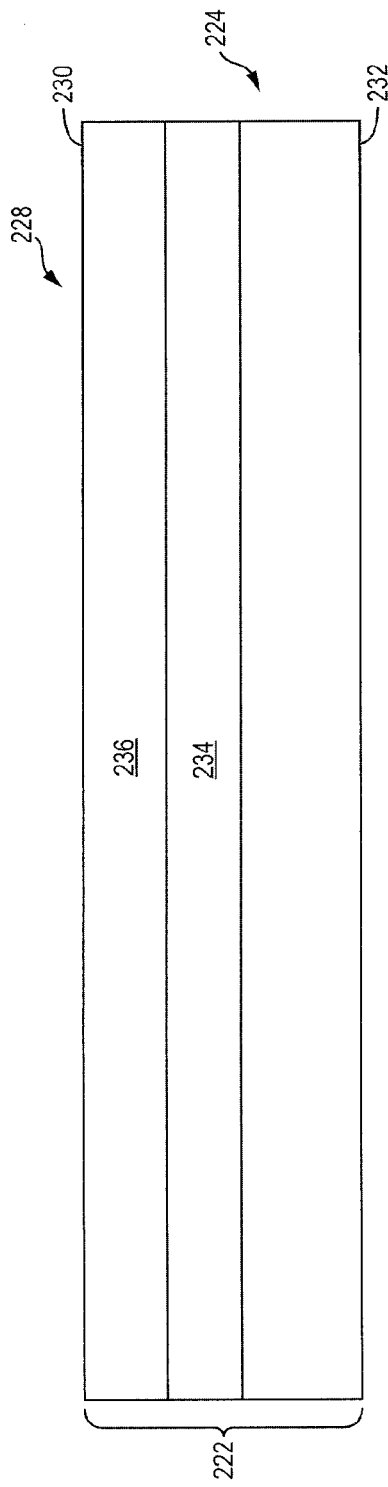
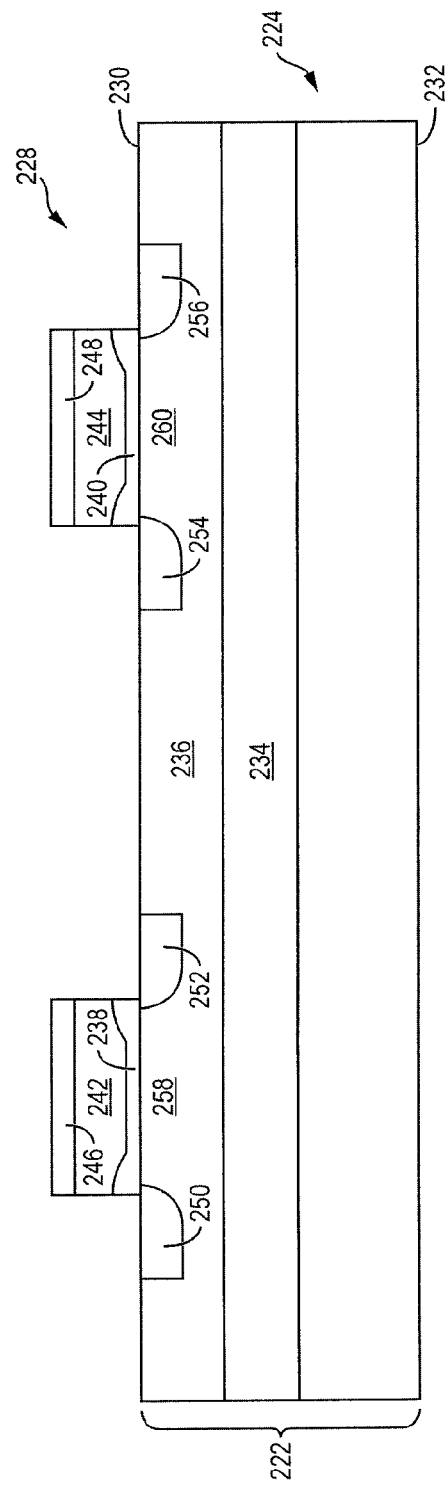

SEMICONDUCTOR DEVICE AND METHOD OF FORMING A POWER MOSFET WITH INTERCONNECT STRUCTURE TO ACHIEVE LOWER RDSON

CLAIM OF DOMESTIC PRIORITY

The present application claims the benefit of U.S. Provisional Application No. 61/602,555, filed Feb. 23, 2012. The present application is a continuation-in-part of U.S. application Ser. No. 12/467,157, filed May 15, 2009, which claim the benefit of U.S. Provisional Application No. 61/053,566, filed May 15, 2008, which applications are incorporated herein by reference.

FIELD OF THE INVENTION

The present invention relates generally to electronic circuits and semiconductor devices and, more specifically, to a semiconductor device and method of forming a power MOSFET with an interconnect structure to achieve a lower RDSON.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die from a given wafer is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Power MOSFETs are one example of semiconductor devices commonly used in electronic circuits, such as communication systems and power supplies. Power MOSFETs are particularly useful when used as electric switches to enable and disable the conduction of relatively large currents. The conductive state of the power MOSFET is controlled by applying and removing a voltage to the gate terminal. When turned on by application of a voltage to the gate terminal, a current flows between the drain terminal and source terminal of the power MOSFET. When turned off by removal of the voltage from the gate terminal, no current flows between the drain terminal and source terminal of the power MOSFET.

The power MOSFET includes a large number of MOSFET cells or individual transistors that are connected in parallel and distributed across a surface of a semiconductor die. The resistance between the drain terminal and source terminal in the conductive state (RDSON) is an important performance parameter of the power MOSFET. The RDSON is determined by the combined resistance of each MOSFET cell, as well as the interconnect structure between the MOSFET cells and external drain, source, and gate terminals of the semiconductor package.

In particular, the power MOSFET inherently requires one or more gate terminals for proper operation. The area designated for the gate terminals is not available for drain and source current conduction. Given a particular semiconductor package size, the drain and source current conduction paths through the interconnect structure may be made substantially smaller and more concentrated in order to accommodate the gate terminals on the package. The concentrated drain and source current conduction paths through the interconnect structure increase the RDSON of the power MOSFET.

SUMMARY OF THE INVENTION

A need exists for a power MOSFET with an interconnect structure having a low RDSON. Accordingly, in one embodiment, the present invention is a method of making a semiconductor device comprising the steps of providing a substrate, forming a first gate structure over the substrate, forming a source region in the substrate adjacent to the first gate structure, forming a first drain region in the substrate adjacent to the first gate structure opposite the source region, and forming an interconnect structure over the substrate by forming a first conductive layer electrically connected to the source region, forming a second conductive layer electrically connected to the first drain region, forming a third conductive layer over the first conductive layer and electrically connected to the first conductive layer, and forming a fourth conductive layer over the second conductive layer and electrically connected to the second conductive layer.

In another embodiment, the present invention is a method of making a semiconductor device comprising the steps of providing a substrate, forming a first gate structure over the substrate, forming a source region in the substrate adjacent to the first gate structure, forming a first drain region in the substrate adjacent to the first gate structure opposite the source region, and forming an interconnect structure over the substrate by forming a conductive plane electrically connected to the source region, and forming a first conductive layer within openings of the conductive plane and electrically connected to the first drain region.

In another embodiment, the present invention is a method of making a semiconductor device comprising the steps of providing a substrate, and forming a first transistor in the substrate. The first transistor includes a first control terminal and first and second conduction terminals. The method further includes the step of forming an interconnect structure over the substrate by forming a conductive plane electrically connected to the first conduction terminal, and forming a first conductive layer within openings of the conductive plane and electrically connected to the second conduction terminal.

In another embodiment, the present invention is a semiconductor device comprising a substrate and first transistor formed in the substrate. The first transistor includes a first control terminal and first and second conduction terminals. An interconnect structure is formed over the substrate. The interconnect structure includes a conductive plane electrically connected to the first conduction terminal, and first conductive layer formed within openings of the conductive plane and electrically connected to the second conduction terminal.

BRIEF DESCRIPTION OF THE DRAWINGS

FIGS. 5a-5k illustrate a dual power MOSFET cell with an interconnect structure containing an intermediate source plane with drain islands for lower resistance;

DETAILED DESCRIPTION OF THE DRAWINGS

Figure 1:
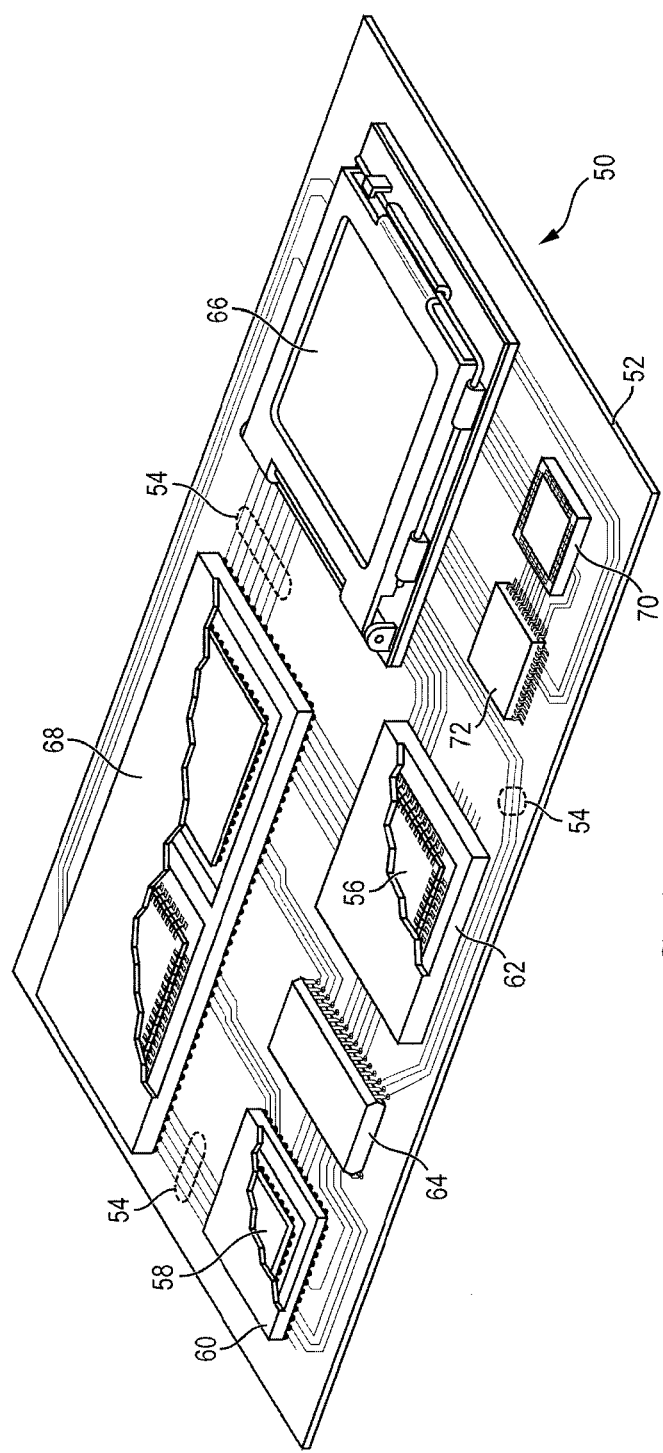
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques, such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, power transistors, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Most modern electronic equipment requires a power supply to provide a DC operating potential to the electronic components contained therein. Common types of electronic equipment which use power supplies include personal computers, energy systems, telecommunication systems, audio-video equipment, consumer electronics, automotive components, portable electronics, data processing centers, and other devices which utilize integrated circuits, semiconductor chips, or otherwise require DC operating potential. Many semiconductor components require a low voltage DC operating potential. However, many sources of electric power are AC, or high voltage DC, which must be converted to low voltage DC for the electronic equipment.

Figure 2:
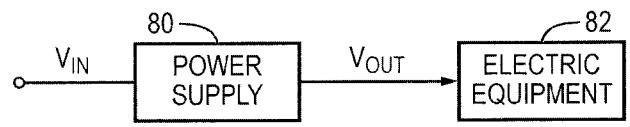
FIG. 2 is a block diagram of a power supply providing operating potential to electronic equipment.

In one common arrangement, the AC/DC power supply receives an AC input voltage, e.g., between 110 and 240 VAC, and converts the AC input voltage to the DC operating voltage. Referring to FIG. 2, a PWM power supply 80 is shown providing a DC operating potential to electronic equipment 82. Power supply 80 receives input voltage $V_{IN}$ and produces one or more DC output voltages. The electronic equipment 82 may take the form of personal computers, energy systems, telecommunication systems, audio-video equipment, consumer electronics, automotive components, portable electronics, data processing centers, and other devices which utilize integrated circuits, semiconductor chips, or otherwise require DC operating potential from the power supply.

Figure 3:
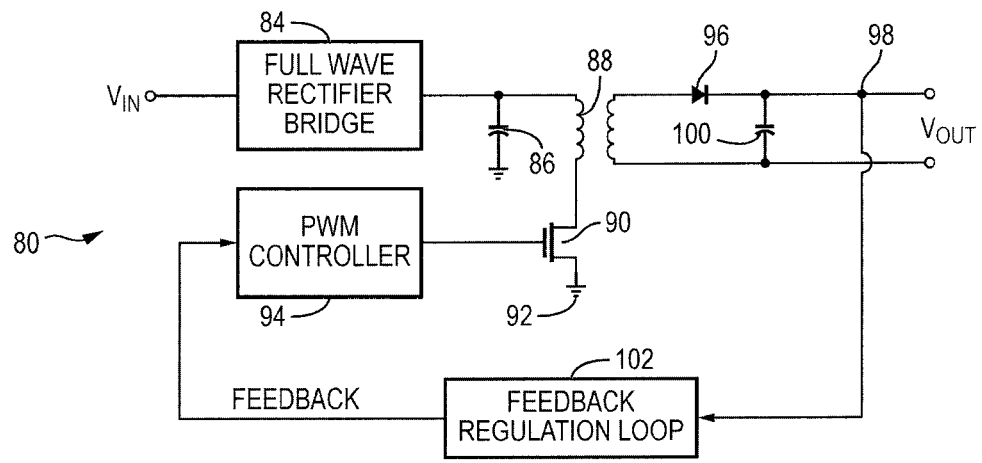
FIG. 3 is a schematic and block diagram of a pulse width modulated power supply.

Further detail of PWM power supply 80 is shown in FIG. 3. The input voltage $V_{IN}$ may be an AC signal, e.g., 110 VAC, or DC signal, e.g., 48 volts. In the case of an AC input voltage, power supply 80 has a full-wave rectifier bridge 84. The full-wave rectifier bridge 84 converts the AC input voltage to a DC voltage. In the case of a DC input voltage, the full-wave rectifier bridge 84 is omitted. Capacitor 86 smoothes and filters the DC voltage. The DC voltage is applied to a primary winding or inductor of transformer 88. The primary winding of transformer 88 is also coupled through power transistor 90 to ground terminal 92. In one embodiment, power transistor 90 is a multi-cell power MOSFET, such as described in FIGS. 4a-4i and FIGS. 5a-5k. The gate of MOSFET 90 receives a PWM control signal from PWM controller 94. The secondary winding of transformer 88 is coupled to rectifier diode 96 to create the DC output voltage $V_{OUT}$ of power supply 80 at node 98. Capacitor 100 filters the DC output voltage $V_{OUT}$. The DC output voltage $V_{OUT}$ is routed back through feedback regulation loop 102 to a control input of PWM controller 94. The DC output voltage $V_{OUT}$ generates the feedback signal which PWM controller 94 uses to regulate the power conversion process and maintain a relatively constant output voltage $V_{OUT}$ under changing loads. The aforedescribed electrical components of the power supply module are typically mounted to and electrically interconnected through a printed circuit board, such as shown in FIG. 1.

In the power conversion process, PWM controller 94 sets the conduction time duty cycle of MOSFET 90 to store energy in the primary winding of transformer 88 and then transfer the stored energy to the secondary winding during the off-time of power MOSFET 90. The output voltage $V_{OUT}$ is determined by the energy transfer between the primary winding and secondary winding of transformer 88. The energy transfer is regulated by PWM controller 94 via the duty cycle of the PWM control signal to power MOSFET 90. Feedback regulation loop 102 generates the feedback signal to PWM controller 94 in response to the output voltage $V_{OUT}$ to set the conduction time duty cycle of power MOSFET 90.

Consider the case where the load increases from zero to some nominal value. As load increases, the output current demand from power supply 80 increases and the output voltage $V_{OUT}$ decreases. The lower output voltage causes PWM controller 94 to increase the pulse width to power MOSFET 90. The longer conduction time of power MOSFET 90 stores more energy in the primary winding of transformer 88. Accordingly, more energy is transferred to the secondary winding of transformer 88 during the off-time of power MOSFET 90. The output voltage $V_{OUT}$ of power supply 80 increases to compensate for the increased current demand.

Figure 4A:
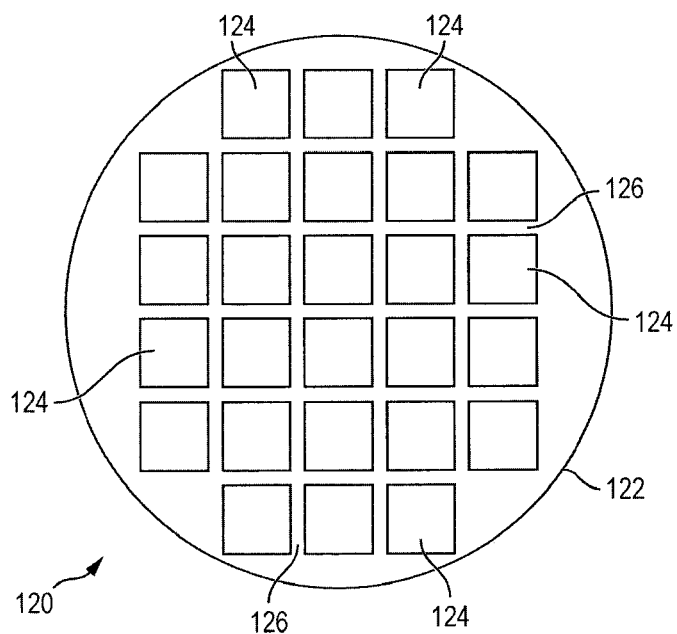
FIGS. 4a-4i illustrate a power MOSFET cell with an interconnect structure containing stacked intermediate conductive layers for lower resistance.

FIGS. 4a-4i illustrate, in relation to FIGS. 1-3, a process of forming a power MOSFET cell with an interconnect structure containing stacked intermediate conductive layers for lower resistance. FIG. 4a shows a semiconductor wafer 120 containing a base material, such as silicon, germanium, gallium arsenide, indium phosphide, or silicon carbide, in substrate 122 for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor die 124 contains a plurality of MOSFET cells electrically connected in parallel to form power MOSFET 90, as described in FIG. 3, for high current carrying capacity in the range of 1-100 amperes (A) with a voltage rating of 2-100 volts (V).

Figure 4B:
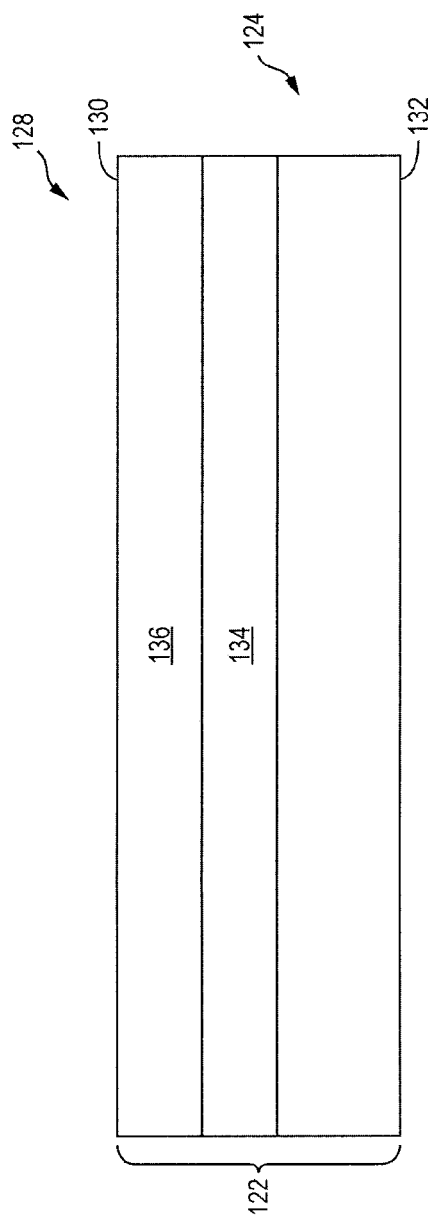

FIG. 4b shows a cross-sectional view of a portion of semiconductor wafer 120 for the formation of MOSFET cell 128, as part of lateral power MOSFET 90, within substrate 122 for semiconductor die 124. Power MOSFET 90 can be an n-channel device (N-MOS) or a p-channel device (P-MOS), where "p" denotes a positive carrier type (hole) and "n" denotes a negative carrier type (electron). Although the present embodiment is described in terms of an N-MOS device, the opposite type semiconductor material can be used to form a P-MOS device. For example, an n-type substrate can be initially doped with n-type semiconductor material, such as phosphorus, antimony, or arsenic impurities.

Substrate 122 includes an active surface 130 and back surface 132 that is opposite the active surface. For N-MOS devices, substrate 122 is initially doped with p-type semiconductor material, such as boron, aluminum, or gallium impurities. In one embodiment, the p-type dopant is deposited by ion implantation with dosage of 1E13 to 1E14 at hundreds of keV. Other implants can be deposited at appropriate dosages and energy levels. No mask is needed for the ion implantation.

Substrate 122 is further doped with a higher concentration of p-type semiconductor material to form deep retrograde $p^+$-well region 134 to a depth of 300 nanometers (nm) below active surface 130 of the substrate. The buried $p^+$-well region 134 reduces base resistance of NPN parasitic structure, reduces punch through effect, serves to clamp the drain-to-source breakdown voltage ($BV_{DSS}$), decreases reverse recovery time, and generally improves robustness of power MOSFET 90. P-well region 136, originating from the initially doped p-type semiconductor material and defined by $p^+$-well region 134, extends to active surface 130.

Figure 4C:
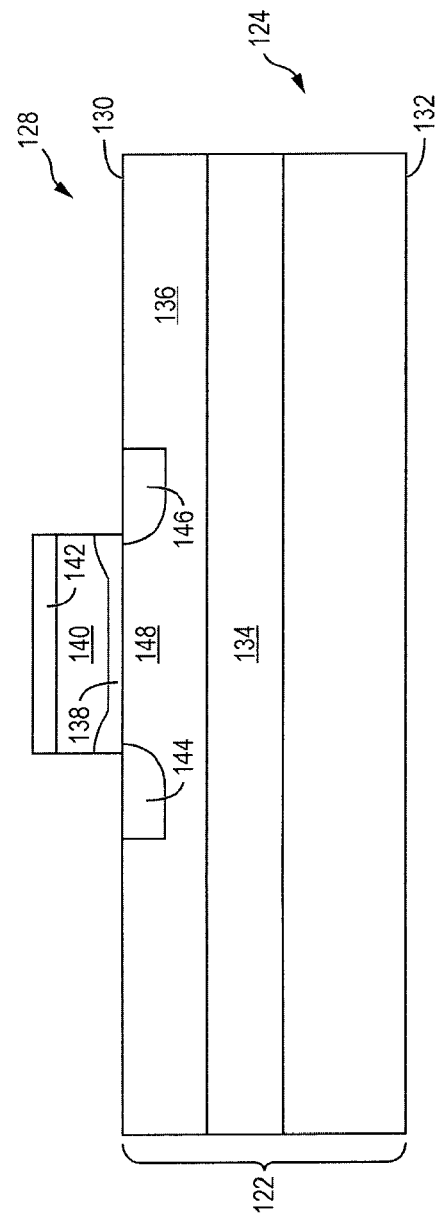

In FIG. 4c, an insulating or dielectric layer 138 is formed over surface 130 of substrate 122 as a gate oxide layer with a thickness of 100-1000 angstroms (Å). The insulating layer 138 contains one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. The insulating layer 138 is formed using PVD, CVD, screen printing, spin coating, spray coating, sintering, or thermal oxidation. A polysilicon layer 140 is formed over insulating layer 138. A silicide layer 142 is formed over polysilicon layer 140. After patterning polysilicon layer 140 and silicide layer 142, semiconductor wafer 120 is oxidized at 900° C. for 10 minutes to increase the thickness of insulating layer 138 around the edges of the gate structure.

Substrate 122 is doped with n-type semiconductor material, such as arsenic or phosphorus, within p-well region 136 to form lightly doped (LDD) regions 144 and 146, self-aligned to polysilicon layer 140, to a depth of 20 nm below surface 130. In one embodiment, the n-type dopant is deposited by ion implantation with dosage of 1E15 to 1E17 ppcm$^3$ at 10-50 keV. Other implants can be deposited at appropriate dosages and energy levels. The LDD regions 144 and 146 can be tuned by dopant levels to reduce punch through effects and control HCI and $BV_{DSS}$. The area between LDD regions 144 and 146 is designated as n-channel 148.

Figure 4D:
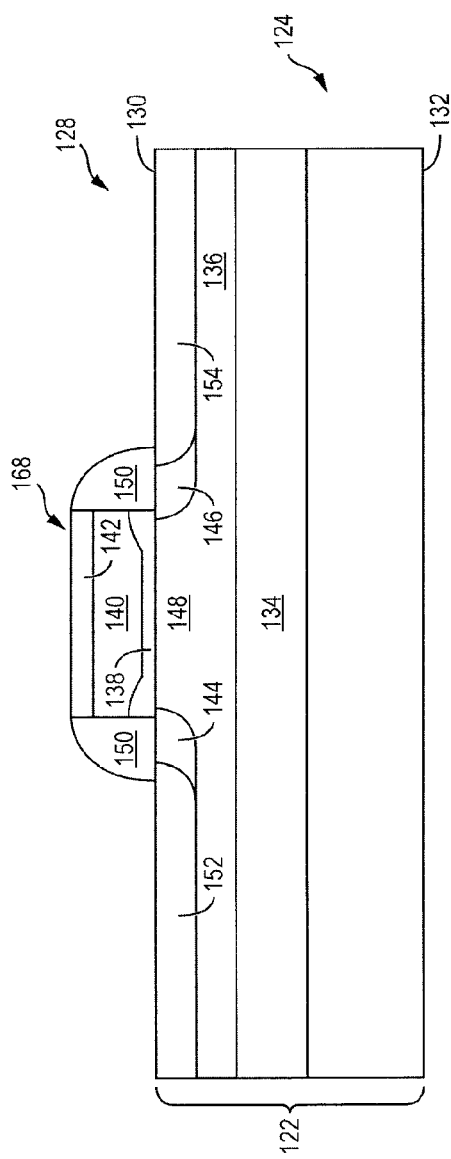

In FIG. 4d, an insulating layer 150 is formed around polysilicon layer 140 and silicide layer 142 using PVD, CVD, screen printing, spin coating, spray coating, sintering, or thermal oxidation. The insulating layer 150 contains one or more layers of SiO2, Si3N4, SiON, Ta2O5, Al2O3, polyimide, BCB, PBO, or other suitable dielectric material. The insulating layer 150 operates as a sidewall spacer to mask subsequent drain and source ion implants. The combination of insulating layer 138, polysilicon layer 140, silicide layer 142, and insulating layer 150 constitute gate structure 168.

Substrate 122 is heavily doped with $n^+$-type semiconductor material, such as arsenic or phosphorus, within p-well region 136 to form N+ source region 152 and N+ drain region 154, self-aligned to sidewall spacer 150, to a depth of 20 nm below surface 130. In one embodiment, the $n^+$-type dopant is deposited by ion implantation with dosage of 1E18 to 1E20 ppcm$^3$ at 10-50 KeV. Other implants can be deposited at appropriate dosages and energy levels.

Figure 4E:
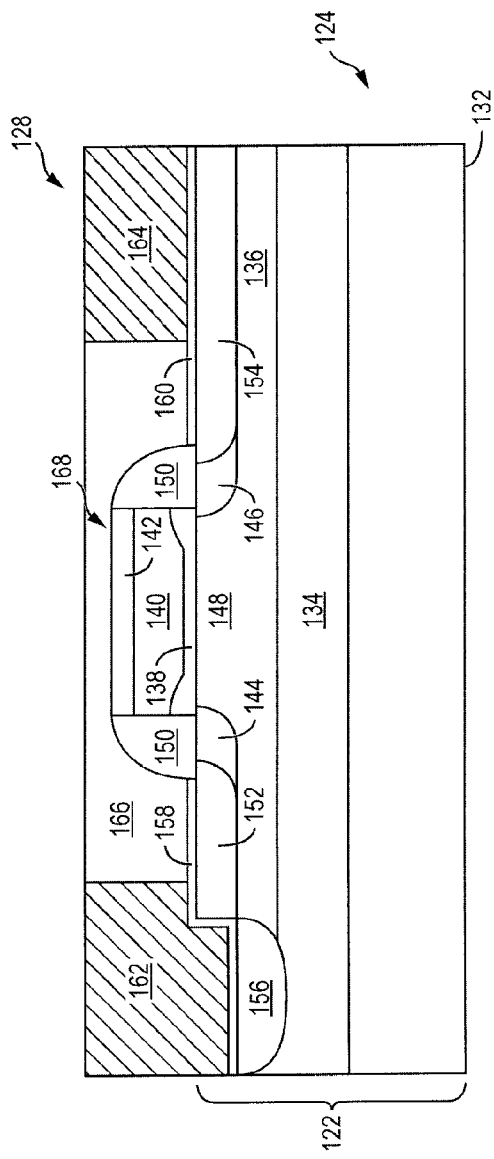

In FIG. 4e, a portion of substrate 122 is removed by a trench etching process using a photoresist layer (not shown) in preparation for the source contact. Substrate 122 is heavily doped with $p^+$-type semiconductor material, such as boron, through p-well region 136 and extending into p-well region 134 to form P+ source contact 156. In one embodiment, the $p^+$-type dopant is deposited by ion implantation with dosage of 1E18 to 1E20 ppcm$^3$ at 10-50 KeV. Other implants can be deposited at appropriate dosages and energy levels.

A silicide layer 158 is formed over P+ source contact 156 and N+ source region 152. A silicide layer 160 is formed over N+ drain region 154. A source-drain anneal at 900° C. for 20 minutes diffuses the N+ regions 152-154 with LDD regions 144-146 and electrically activates the dopants within the regions. The N+ source region 152 and N+ drain region 154 have a low resistance ohmic contact for MOSFET cell 128.

A source contact 162 is formed within the trench over silicide layer 158 and electrically connected to N+ source region 152. A drain contact 164 is formed over silicide layer 160 and electrically connected to N+ drain region 154. Source contact 162 and drain contact 164 can be patterned and deposited using electrolytic plating, electroless plating, sputtering, PVD, CVD, or other suitable metal deposition process. Source contact 162 and drain contact 164 can be one or more layers of tungsten (W), aluminum (Al), copper (Cu), tin (Sn), nickel (Ni), gold (Au), silver (Ag), titanium (Ti), or other suitable conductive material. Drain contact 164 is shown for completeness but can be disposed in a different vertical plane than source contact 162. An insulating layer 166 is formed over substrate 122 and gate structure 168 between source contact 162 and drain contact 164. Alternatively, insulating layer 166 is formed prior to source contact 162 and drain contact 164. A portion of insulating layer 166 is removed by an etching process to form source contact 162 and drain contact 164 down to silicide layers 158 and 160.

In operation of MOSFET cell 128, a voltage is applied to gate structure 168 to create an electric field across channel 148. A current flows through source contact 162 and N+ source region 152 across channel 148 to N+ drain region 154 and drain contact 164. A large number of MOSFET cells 128 are connected in parallel across substrate 122 to conduct a total current through lateral power MOSFET 90 in the range of 1-100 A (amperes) with a voltage rating of 2-100 V.

Figure 4F:
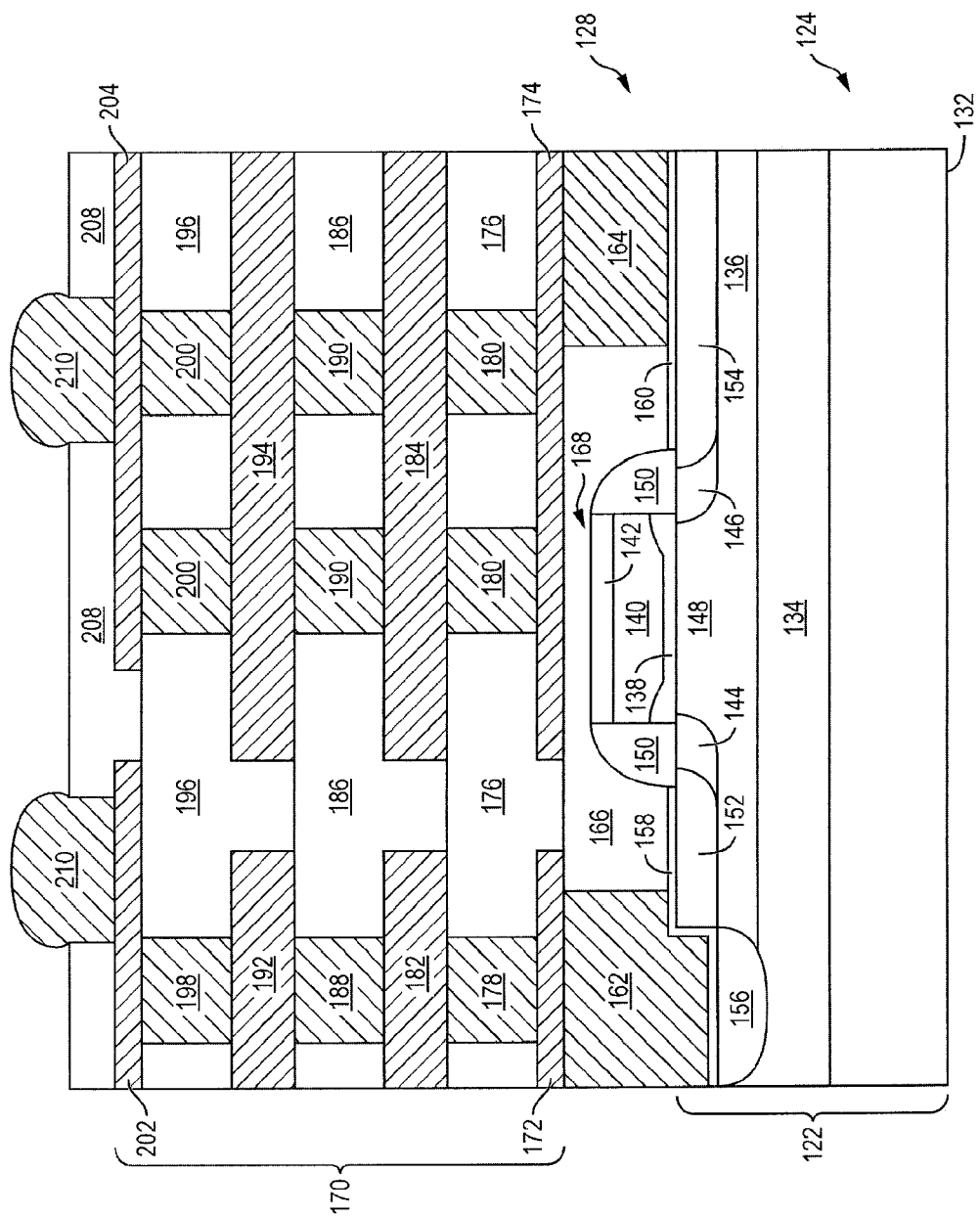

FIG. 4f shows an interconnect structure 170 for MOSFET cells 128. The interconnect structure 170 includes a plurality of conductive layers, conductive vias, and insulating layers. In general, the conductive layers are patterned and deposited using electrolytic plating, electroless plating, sputtering, PVD, CVD, or other suitable metal deposition process. The conductive layers can be one or more layers of Cu, Sn, Ni, Au, Ag, Al, Ti, or other suitable conductive material. The insulating layers are formed using PVD, CVD, screen printing, spin coating, spray coating, sintering, or thermal oxidation. The insulating layers can be one or more layers of SiO2, Si3N4, SiON, Ta2O5, Al2O3, polyimide, BCB, PBO, or other suitable insulating material. A plurality of vias is formed through the insulating layers by etching, mechanical drilling, or laser drilling. The vias are filled with conductive material, such as W, Al, Cu, Sn, Ni, Au, Ag, or Ti, using electrolytic plating, electroless plating process, or other suitable deposition process to form the conductive vias.

More specifically, a conductive layer 172 is formed over source contact 162 and insulating layer 166 as a source metal 1 layer. A conductive layer 174 is formed over drain contact 164 and insulating layer 166 as a drain metal 1 layer. An insulating layer 176 is formed over conductive layers 172 and 174 and insulating layer 166. A conductive via 178 is formed through insulating layer 176 and electrically connected to conductive layer 172. Conductive vias 180 are formed through insulating layer 176 and electrically connected to conductive layer 174. A conductive layer 182 is formed over insulating layer 176 and electrically connected to conductive via 178 as a source metal 2 layer. A conductive layer 184 is formed over insulating layer 176 and electrically connected to conductive vias 180 as a drain metal 2 layer. An insulating layer 186 is formed over conductive layers 182 and 184 and insulating layer 176. A conductive via 188 is formed through insulating layer 186 and electrically connected to conductive layer 182. Conductive vias 190 are formed through insulating layer 186 and electrically connected to conductive layer 184. A conductive layer 192 is formed over insulating layer 186 and electrically connected to conductive via 188 as a source metal 3 layer. A conductive layer 194 is formed over insulating layer 186 and electrically connected to conductive vias 190 as a drain metal 3 layer.

Source metal 2 layer (conductive layer 182) and source metal 3 layer (conductive layer 192) are stacked and electrically common to increase the effective thickness of the intermediate conductive layers. Likewise, drain metal 2 layer (conductive layer 184) and drain metal 3 layer (conductive layer 194) are stacked and electrically common to increase the effective thickness of the intermediate conductive layers. In one embodiment, the overall thickness of source metal 2 layer and source metal 3 layer, and correspondingly drain metal 2 layer and drain metal 3 layer, is 3 micrometers (μm). The stacked intermediate conductive layers 182, 184, 192, and 194 reduce resistance of interconnect structure 170 and accordingly the RDSON of power MOSFET 90.

Figure 4G:
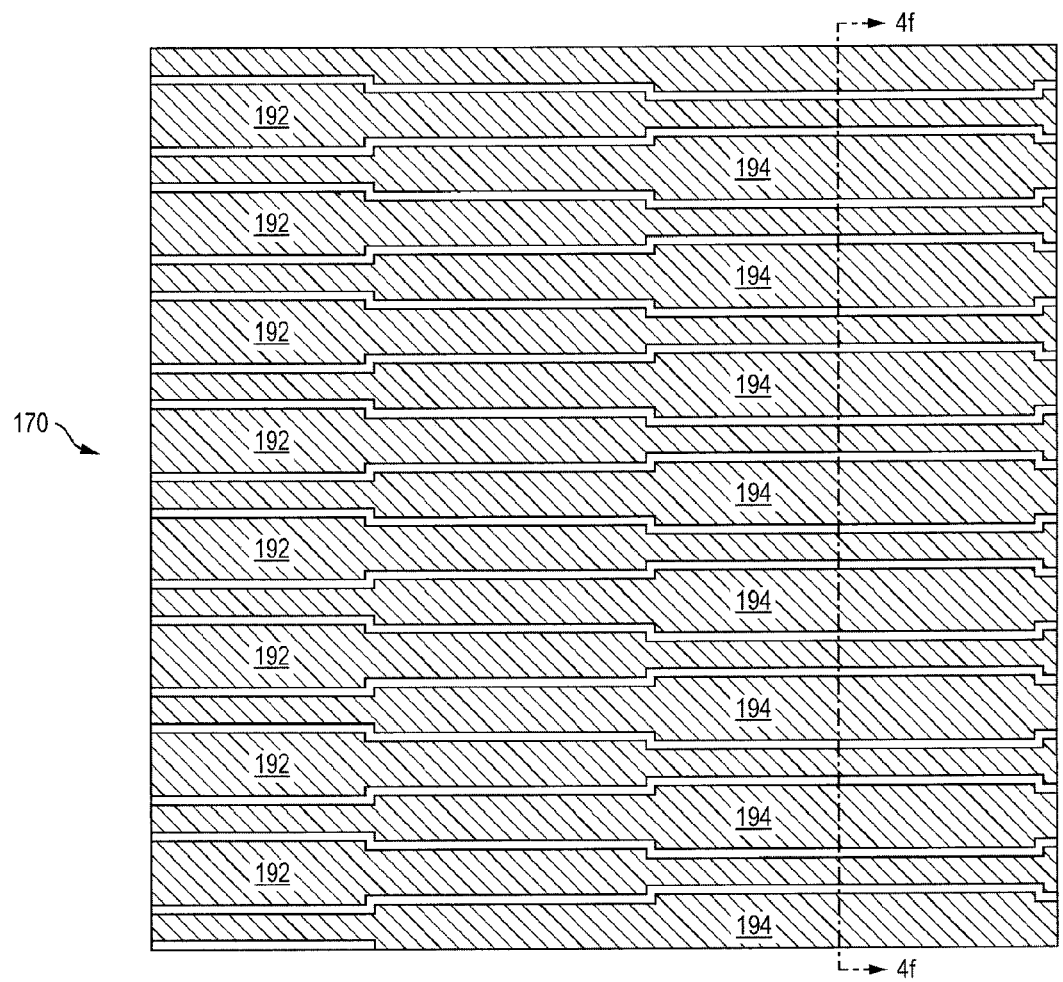

Conductive layers 182, 184, 192, and 194 are arranged in an alternating strip pattern that extends into the page of FIG. 4f. FIG. 4g shows a plan view of conductive layers 192 and 194 arranged in the alternating strip pattern. Conductive layers 182 and 184 have the same alternating strip pattern disposed under conductive layers 192 and 194. Current flow is uni-directional along the conductive strips. Conductive layer 194 (drain) is shown wider than conductive layer 192 (source) along line 4f-4f of FIG. 4g, i.e., under the drain terminal where drain current density is higher. Conductive layer 192 (source) is shown wider than conductive layer 194 (drain) under the source terminal where source current density is higher.

Returning to FIG. 4f, an insulating layer 196 is formed over conductive layers 192 and 194 and insulating layer 186. A conductive via 198 is formed through insulating layer 196 and electrically connected to conductive layer 192. Conductive vias 200 are formed through insulating layer 196 and electrically connected to conductive layer 194. A conductive layer 202 is formed over insulating layer 196 and electrically connected to conductive via 198 as a source metal 4 layer. A conductive layer 204 is formed over insulating layer 196 and electrically connected to conductive vias 200 as a drain metal 4 layer. Conductive vias 180, 190, and 200 are shown for completeness but can be disposed in a different vertical plane than conductive vias 178, 188, and 198.

Figure 4H:
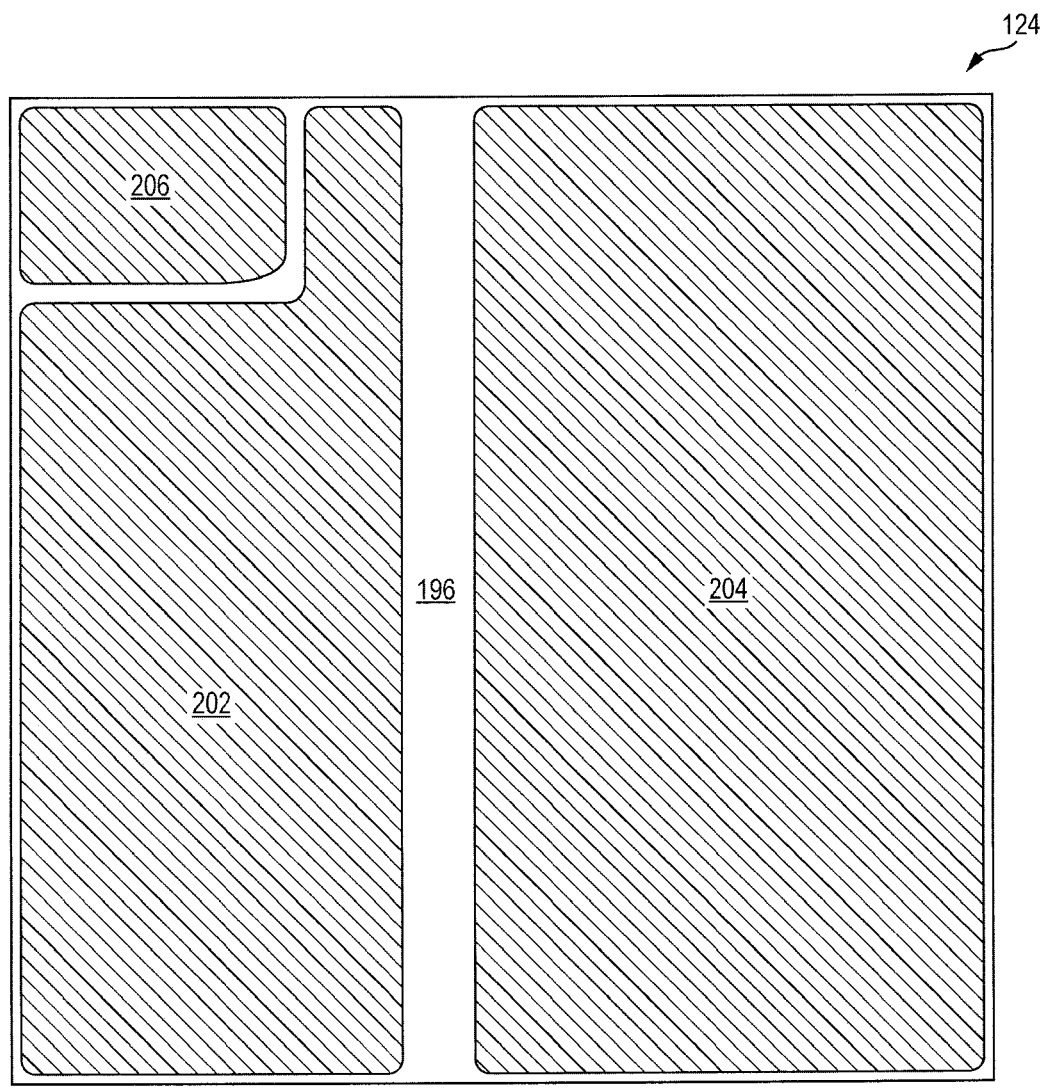

FIG. 4h shows a plan view of conductive layers 202 and 204 and insulating layer 196. A conductive layer 206 (not shown in FIG. 4f) is formed over insulating layer 196 and electrically connected to gate structure 168.

Returning to FIG. 4f, a passivation or insulating layer 208 is formed over conductive layers 202-206 and insulating layer 196. A portion of insulating layer 208 is removed by etching or laser direct ablation (LDA) to expose conductive layers 202-206. An electrically conductive bump material is deposited over the exposed portion of conductive layers 202-206 using an evaporation, electrolytic plating, electroless plating, ball drop, stenciling, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 202-206 using a suitable attachment or bonding process. In one embodiment, the bump material is reflowed by heating the material above its melting point to form balls or bumps 210. In some applications, bumps 210 are reflowed a second time to improve electrical contact to conductive layers 202-206. Bumps 210 can also be compression bonded to conductive layers 202-206. Bumps 210 represent one type of interconnect structure that can be formed over conductive layers 202-206. The interconnect structure can also use stud bump, micro bump, or other electrical interconnect.

Figure 4I:
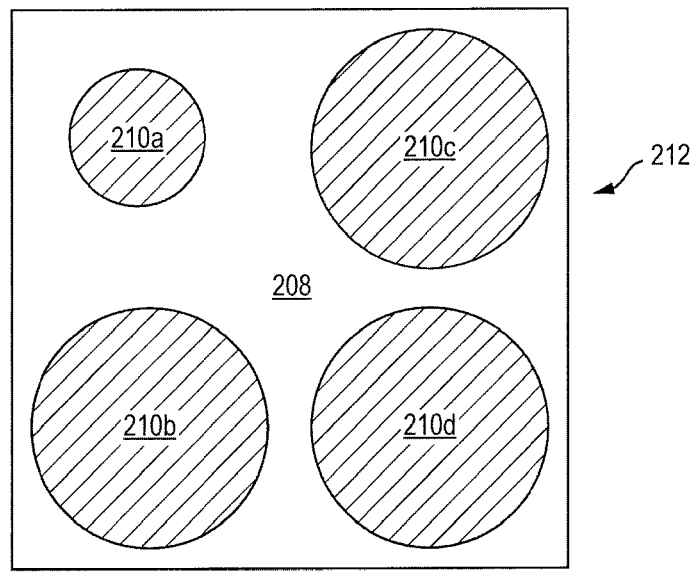

FIG. 4i shows a plan view of LGA semiconductor package 212 containing lateral power MOSFET 90 with bump 210a as a gate terminal electrically connected to conductive layer 206 and gate structure 168, bump 210b as a source terminal electrically connected to conductive layer 202, and bumps 210c and 210d as drain terminals electrically connected to conductive layer 204. The size of LGA package 212 ranges from 0.5×0.5 mm to 3.0×3.0 mm. Power MOSFET 90 occupies a substantial portion of the LGA package footprint. Bumps 210b-210d are relatively large diameter 300 μm for lower contact resistance. In addition, the multiple layers and effective thickness of source metal 2 layer (conductive layer 182) and source metal 3 layer (conductive layer 192), and the multiple layers effective thickness of drain metal 2 layer (conductive layer 184) and drain metal 3 layer (conductive layer 194), reduce resistance of interconnect structure 170 and accordingly the RDSON of power MOSFET 90.

Figure 5A:
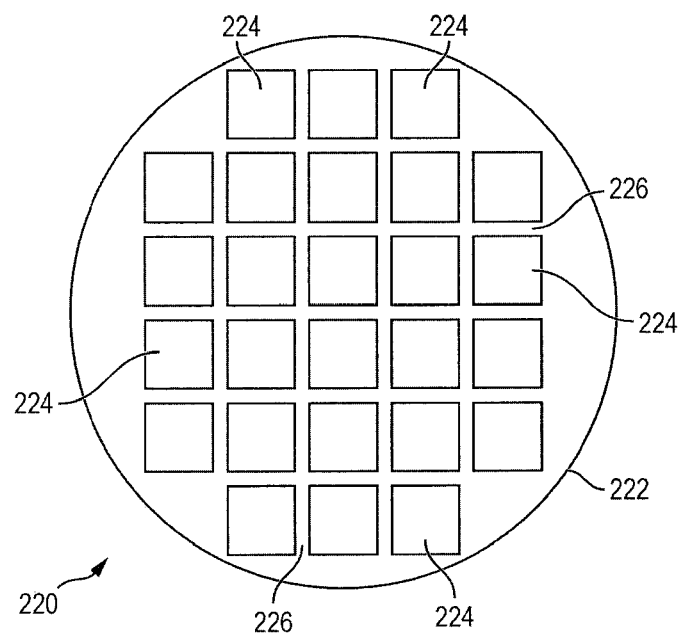

FIGS. 5a-5k illustrate, in relation to FIGS. 1-3, a process of forming dual power MOSFET cells with an interconnect structure containing an intermediate source plane with drain islands for lower resistance. FIG. 5a shows a semiconductor wafer 220 containing a base material, such as silicon, germanium, gallium arsenide, indium phosphide, or silicon carbide, in substrate 222 for structural support. A plurality of semiconductor die or components 224 is formed on wafer 220 separated by a non-active, inter-die wafer area or saw street 226 as described above. Saw street 226 provides cutting areas to singulate semiconductor wafer 220 into individual semiconductor die 224. In one embodiment, semiconductor die 224 contains a plurality of MOSFET cells electrically connected in parallel to form lateral power MOSFET 90, as described in FIG. 3, for high current carrying capacity.

FIG. 5b shows a cross-sectional view of a portion of semiconductor wafer 220 for the formation of MOSFET cell 228, as part of lateral power MOSFET 90, within substrate 222 for semiconductor die 224. Substrate 222 includes an active surface 230 and back surface 232 that is opposite the active surface. For N-MOS devices, substrate 222 is initially doped with p-type semiconductor material, such as boron, aluminum, or gallium impurities. In one embodiment, the p-type dopant is deposited by ion implantation with dosage of 1E13 to 1E14 at hundreds of keV. Other implants can be deposited at appropriate dosages and energy levels. No mask is needed for the ion implantation.

Substrate 222 is further doped with a higher concentration of p-type semiconductor material to form deep retrograde $p^+$-well region 234 to a depth of 300 nm below active surface 230 of the substrate. The buried p$^+$-well region 234 reduces base resistance of NPN parasitic structure, reduces punch through effect, serves to clamp the $BV_{DSS}$, decreases reverse recovery time, and generally improves robustness of power MOSFET 90. P-well region 236, originating from the initially doped p-type semiconductor material and defined by p$^+$-well region 234, extends to active surface 230.

In FIG. 5c, insulating or dielectric layers 238 and 240 are formed over surface 230 of substrate 222 as gate oxide layers with a thickness of 100-1000 Å for the dual MOSFETs in semiconductor die 224. The insulating layers 238 and 240 contain one or more layers of SiO2, Si3N4, SiON, Ta2O5, Al2O3, polyimide, BCB, PBO, or other suitable dielectric material. The insulating layers 238 and 240 are formed using PVD, CVD, screen printing, spin coating, spray coating, sintering, or thermal oxidation. A polysilicon layer 242 is formed over insulating layer 238, and polysilicon layer 244 is formed over insulating layer 240. A silicide layer 246 is formed over polysilicon layer 242, and silicide layer 248 is formed over polysilicon layer 244. After patterning polysilicon layer 242 and silicide layer 244, semiconductor wafer 120 is oxidized at 900° C. for 10 minutes to increase the thickness of insulating layer 238 and 240 around the edges of the gate structure.

Substrate 222 is doped with n-type semiconductor material, such as arsenic or phosphorus, within p-well region 236 to form LDD regions 250 and 252, self-aligned to polysilicon layer 242, to a depth of 20 nm below surface 230. Likewise, LDD regions 254 and 256 are formed within p-well region 236, self-aligned to polysilicon layer 244. In one embodiment, the n-type dopant is deposited by ion implantation with dosage of 1E15 to 1E17 ppcm$^3$ at 10-50 keV. Other implants can be deposited at appropriate dosages and energy levels. The LDD regions 250-256 can be tuned by dopant levels to reduce punch through effects and control HCI and $BV_{DSS}$. The area between LDD regions 250 and 252 is designated as n-channel 258, and the area between LDD regions 254 and 256 is designated as n-channel 260 for the dual MOSFETs in semiconductor die 224.

Figure 5D:
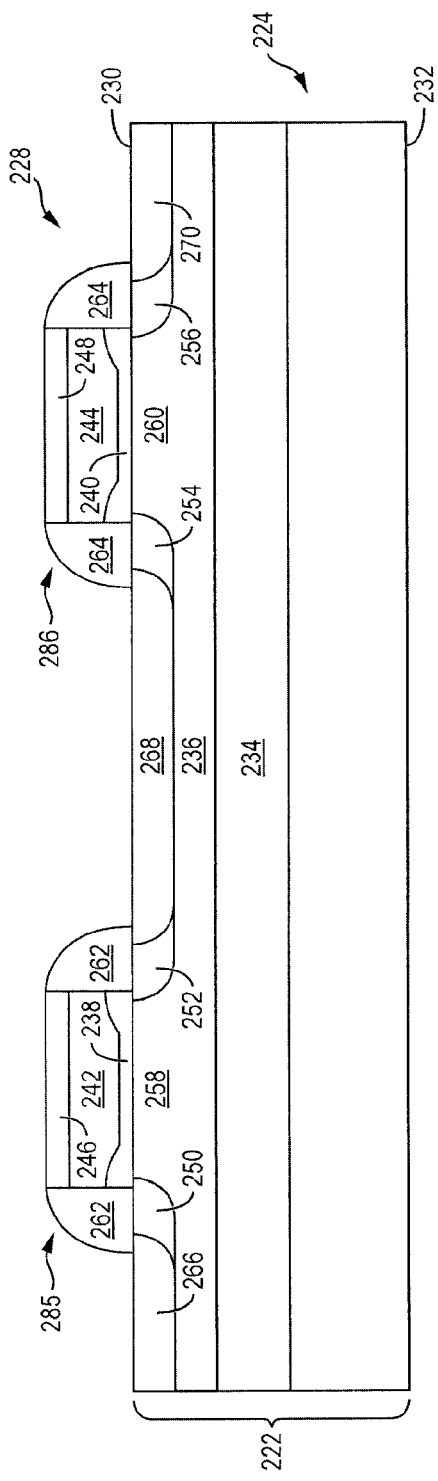

In FIG. 5d, an insulating layer 262 is formed around polysilicon layer 242 and silicide layer 246, and insulating layer 264 is formed around polysilicon layer 244 and silicide layer 248, using PVD, CVD, screen printing, spin coating, spray coating, sintering, or thermal oxidation. The insulating layers 262 and 264 contain one or more layers of SiO2, Si3N4, SiON, Ta2O5, Al2O3, polyimide, BCB, PBO, or other suitable dielectric material. The insulating layers 262 and 264 operate as sidewall spacers to mask subsequent drain and source ion implants.

Substrate 222 is heavily doped with n$^+$-type semiconductor material, such as arsenic or phosphorus, within p-well region 236 to form N+ drain region 266, N+ source region 268, and N+ drain region 270, self-aligned to sidewall spacers 262 and 264, to a depth of 20 nm below surface 230. In one embodiment, the n$^+$-type dopant is deposited by ion implantation with dosage of 1E18 to 1E20 ppcm$^3$ at 10-50 KeV. Other implants can be deposited at appropriate dosages and energy levels.

Figure 5E:
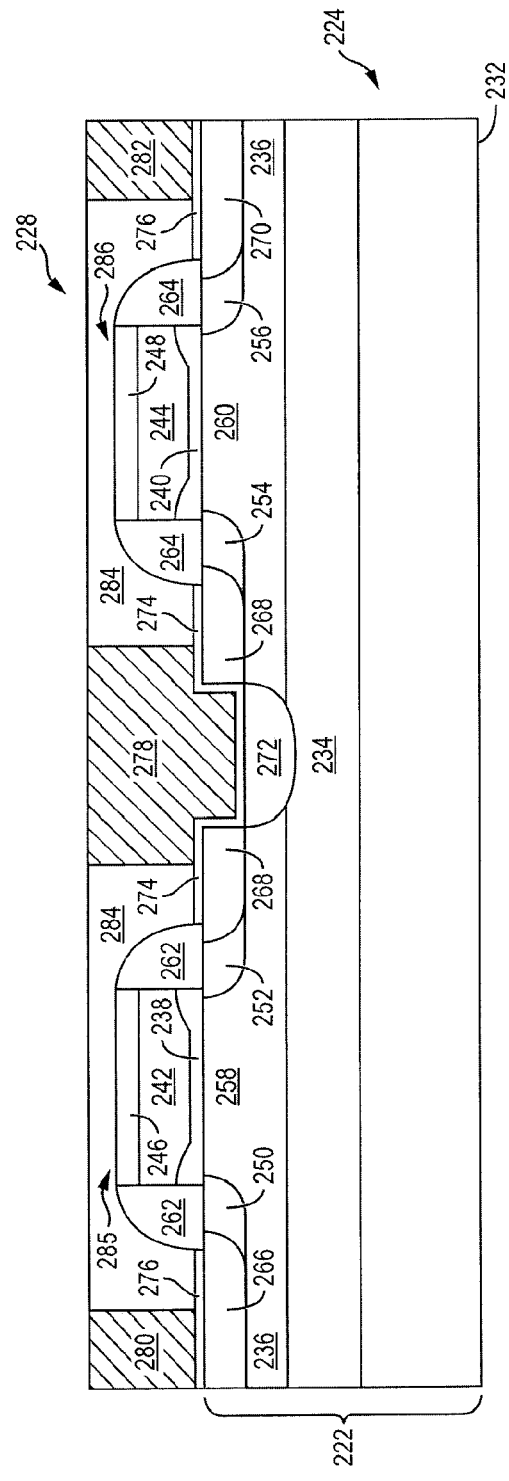

In FIG. 5e, a portion of substrate 222 is removed by a trench etching process using a photoresist layer in preparation for the source contact. Substrate 222 is heavily doped into the trench with p$^+$-type semiconductor material, such as boron, through p-well region 236 and extending into p-well region 234 to form P+ source contact 272. In one embodiment, the p$^+$-type dopant is deposited by ion implantation with dosage of 1E18 to 1E20 ppcm$^3$ at 10-50 KeV. Other implants can be deposited at appropriate dosages and energy levels.

A silicide layer 274 is formed over N+ source region 268 and P+ source contact 272. A silicide layer 276 is formed over N+ drain region 266 and N+ drain region 270. A source-drain anneal at 900° C. for 20 minutes diffuses the N+ regions 266-270 with LDD regions 250-256 and electrically activates the dopants within the regions. The N+ regions 266-270 have a low resistance ohmic contact for MOSFET cell 228.

A source contact 278 is formed within the trench over silicide layer 274 and electrically connected to N+ source region 268. A drain contact 280 is formed over silicide layer 276 and electrically connected to N+ drain region 266. A drain contact 282 is formed over silicide layer 276 and electrically connected to N+ drain region 270. Source contact 278 and drain contacts 280 and 282 can be patterned and deposited using electrolytic plating, electroless plating, sputtering, PVD, CVD, or other suitable metal deposition process. Source contact 278 and drain contacts 280 and 282 can be one or more layers of W, Al, Cu, Sn, Ni, Au, Ag, Ti, or other suitable conductive material. Drain contacts 280 and 282 are shown for completeness but can be disposed in a different vertical plane than source contact 278. An insulating layer 284 is formed over silicide layers 274-276 and gate structure 285 between drain contact 280 and source contact 278, and over silicide layers 274-276 and gate structure 286 between source contact 278 and drain contact 282. Alternatively, insulating layer 284 is formed prior to source contact 278 and drain contacts 280 and 282. A portion of insulating layer 284 is removed by an etching process to form source contact 278 and drain contacts 280 and 282 down to silicide layers 274 and 276.

In operation of MOSFET cell 228, a voltage is applied to gate structures 285 and 286 to create an electric field across channels 258 and 260. A current flows through source contact 278 and N+ source region 268 across channel 258 to N+ drain region 266 and drain contact 280. Likewise, a current flows through source contact 278 and N+ source region 268 across channel 260 to N+ drain region 270 and drain contact 282. In the dual MOSFET arrangement of semiconductor die 224, both drain currents merge into common source contact 278. A large number of MOSFET cells 228 are connected in parallel across substrate 222 to conduct a total current through lateral power MOSFET 90 in the range of 1-100 A with a voltage rating of 2-100 V.

Figure 5F:
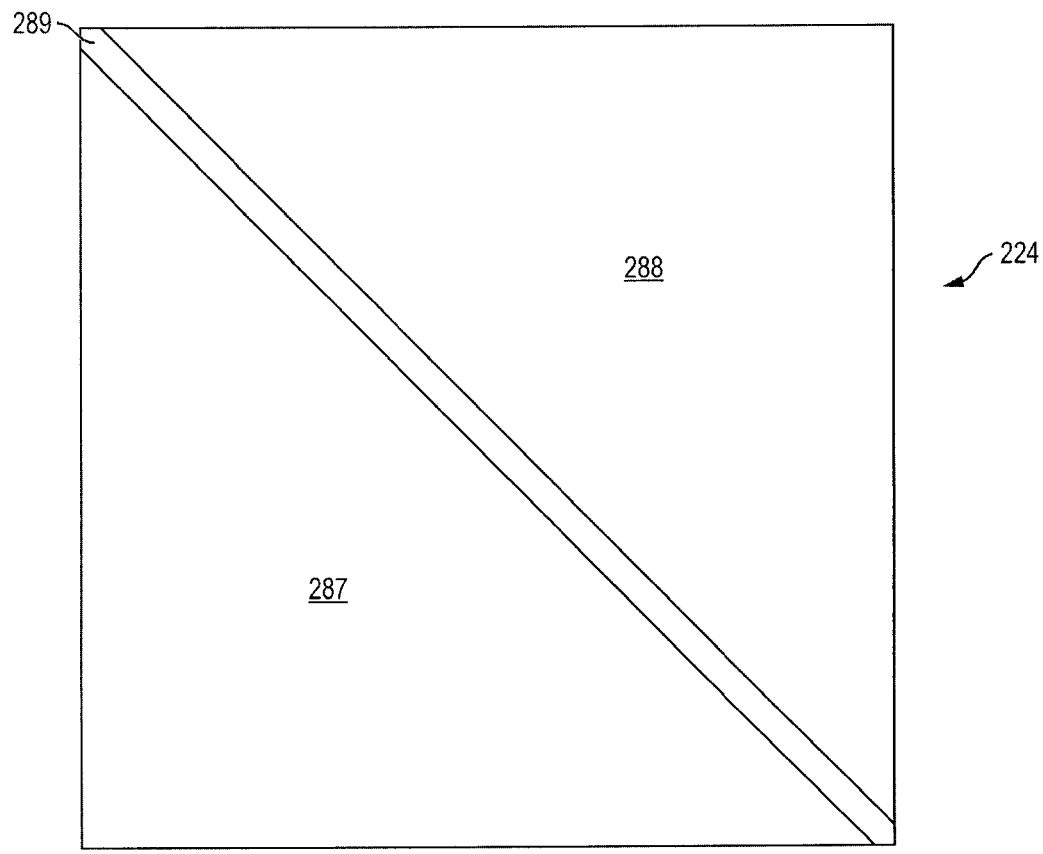

In one embodiment, semiconductor die 224 is a dual power MOSFET layout, as shown in the plan view of FIG. 5f. Power MOSFET 287 contains a plurality of power MOSFET cells 228 arranged on half of semiconductor die 224 with a common drain and common source for the power MOSFET cells within power MOSFET 287. Power MOSFET 288 contains a plurality of power MOSFET cells 228 arranged on half of semiconductor die 224 with a common drain and common source for the power MOSFET cells within power MOSFET 288. Power MOSFETs 287 and 288 have separate drain terminals for the common drains of power MOSFET cells 228 on each half of semiconductor die 224. Power MOSFETs 287 and 288 share a common source terminal along a diagonal 289 of semiconductor die 224 for the common sources of power MOSFET cells 228. FIG. 5f is representative of the power MOSFET cells along diagonal 289. FIG. 4e is representative of the power MOSFET cells interior to power MOSFETs 287 and 288.

Figure 5G:
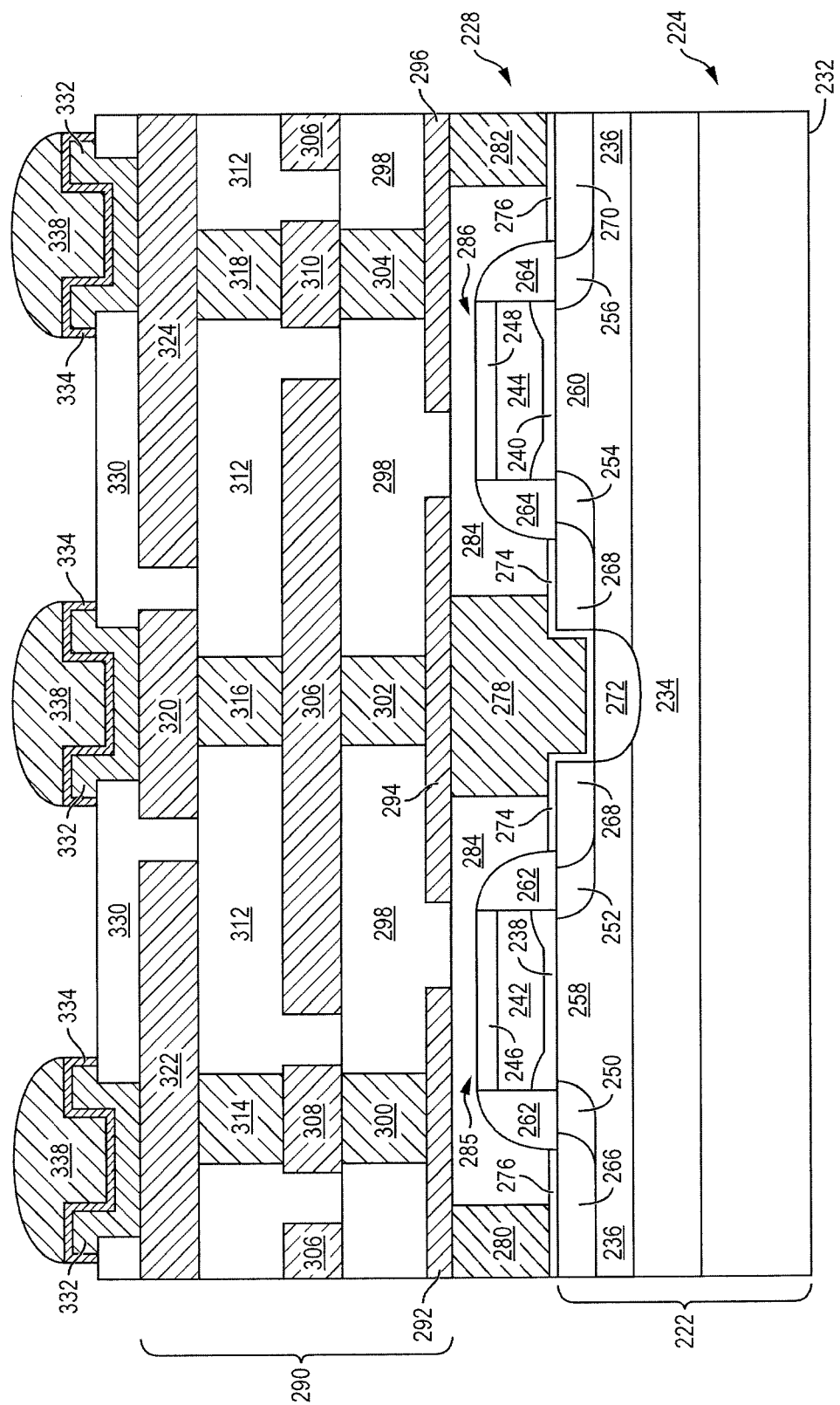

FIG. 5g shows an interconnect structure 290 for MOSFET cells 228. The interconnect structure 290 includes a plurality of conductive layers, conductive vias, and insulating layers. In general, the conductive layers are patterned and deposited using electrolytic plating, electroless plating, sputtering, PVD, CVD, or other suitable metal deposition process. The conductive layers can be one or more layers of Cu, Sn, Ni, Au, Ag, Al, Ti, or other suitable conductive material. The insulating layers are formed using PVD, CVD, screen printing, spin coating, spray coating, sintering, or thermal oxidation. The insulating layers can be one or more layers of SiO2, Si3N4, SiON, Ta2O5, Al2O3, polyimide, BCB, PBO, or other suitable insulating material. A plurality of vias is formed through the insulating layers by etching, mechanical drilling, or laser drilling. The vias are filled with conductive material, such as W, Al, Cu, Sn, Ni, Au, Ag, or Ti, using electrolytic plating, electroless plating process, or other suitable deposition process to form the conductive vias.

Figure 5H:
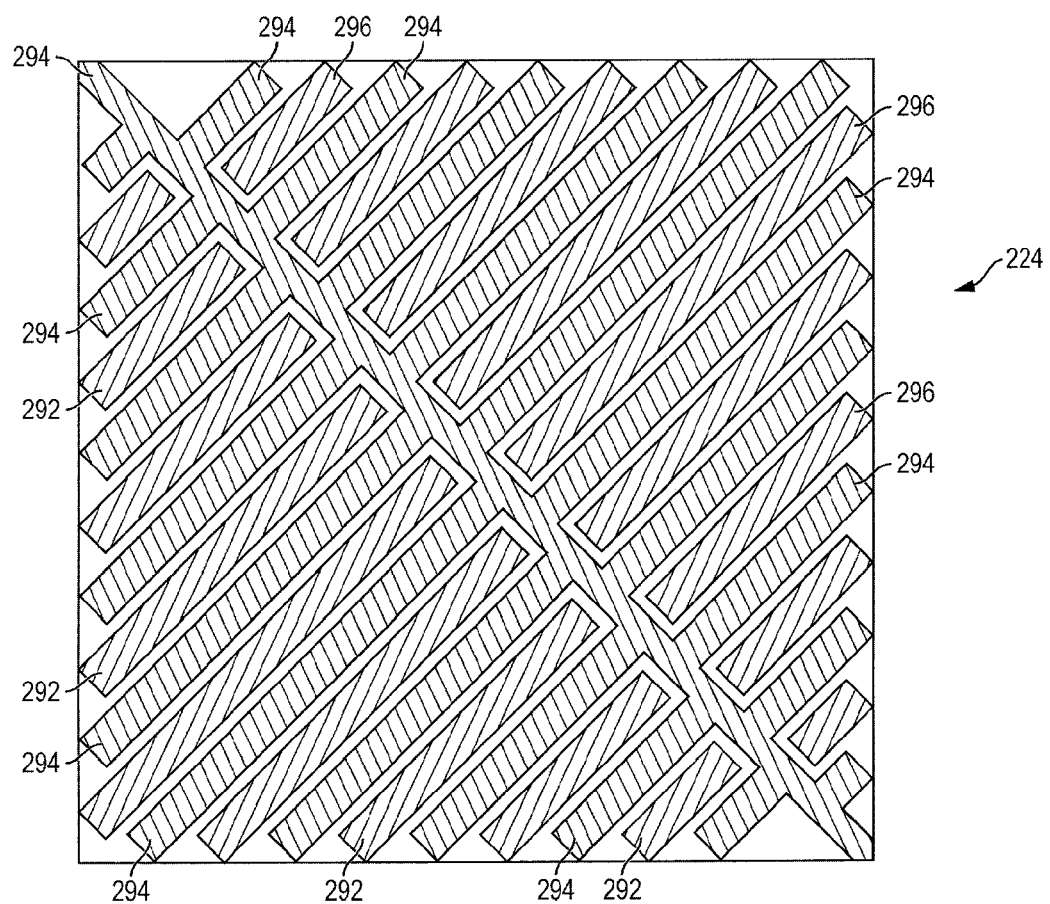

More specifically, a conductive layer 292 is formed over drain contact 280 and insulating layer 284 as a drain metal 1 layer. A conductive layer 294 is formed over source contact 278 and insulating layer 284 as a source metal 1 layer. A conductive layer 296 is formed over drain contact 282 and insulating layer 284 as a drain metal 1 layer. FIG. 5h shows a plan view of source metal 1 layer and drain metal 1 layer (conductive layers 292-296) arranged in an alternating strip pattern. The segments of conductive layer 292 are electrically common but electrically isolated from conductive layers 294 and 296. The segments of conductive layer 294 are electrically common but electrically isolated from conductive layers 292 and 296. The segments of conductive layer 296 are electrically common but electrically isolated from conductive layers 292 and 294.

Returning to FIG. 5g, an insulating layer 298 is formed over conductive layers 292-296 and insulating layer 284. A conductive via 300 is formed through insulating layer 298 and electrically connected to conductive layer 292. A conductive via 302 is formed through insulating layer 298 and electrically connected to conductive layer 294. A conductive via 304 is formed through insulating layer 298 and electrically connected to conductive layer 296. A conductive layer 306 is formed over insulating layer 298 and electrically connected to conductive via 302 as a source metal 2 plane. A conductive layer 308 is formed over insulating layer 298 and electrically connected to conductive via 300 as a drain metal 2 layer. A conductive layer 310 is formed over insulating layer 298 and electrically connected to conductive via 304 as a drain metal 2 layer. Conductive vias 302 and 316 are shown for completeness but can be disposed in a different vertical plane than conductive vias 300, 304, 314, and 318.

Figure 5I:
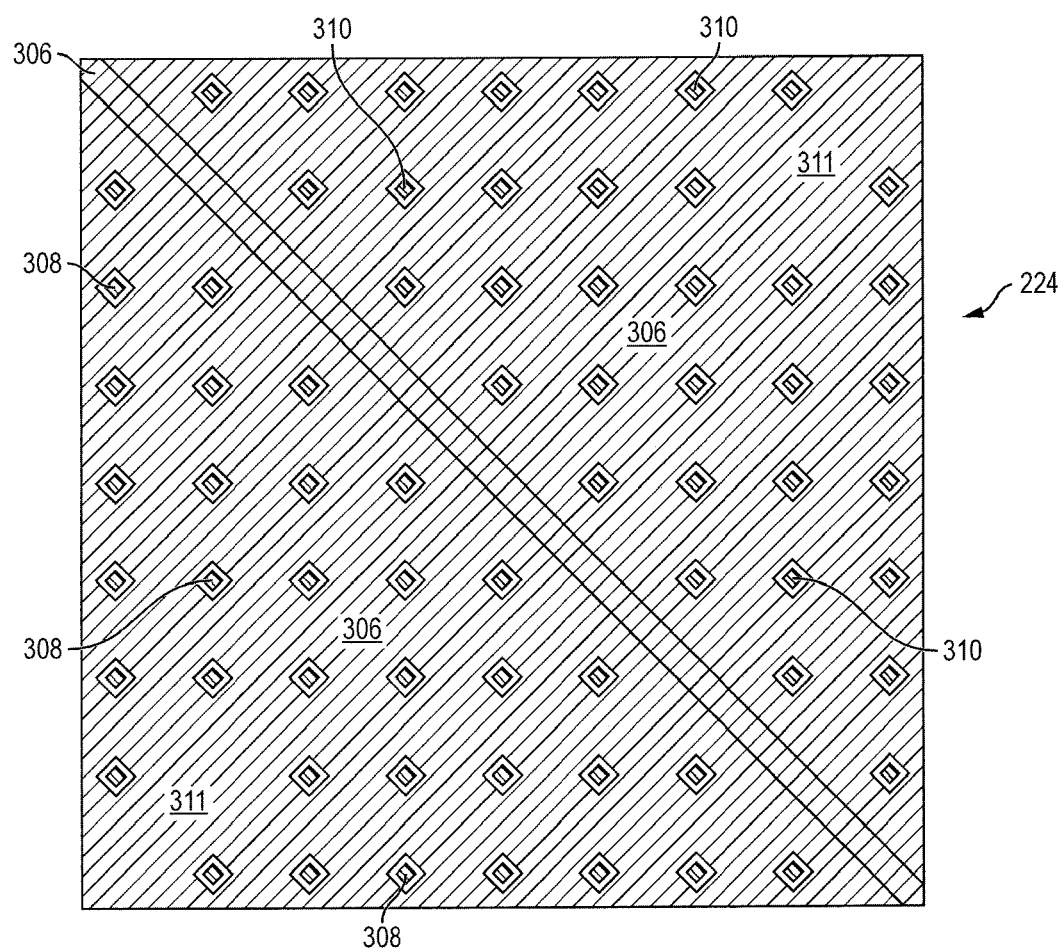

FIG. 5i shows a plan view of source metal 2 layer (conductive layer 306) arranged in a plane structure across semiconductor die 224 to reduce resistance of interconnect structure 290 by distributing current density across the source metal plane. Current flow is distributed omnidirectional across the source metal 2 plane to reduce the RDSON of power MOSFET 90. Drain metal 2 layers (conductive layers 308 and 310) are formed as islands within the source metal 2 plane for vertical interconnect of drain contacts 280 and 282 through the source metal 2 plane. In one embodiment, there are no drain islands formed in relatively small areas 311. The remainder of the plane structure across semiconductor die 224 is available for source metal 2 layers and drain metal 2 layers.

Returning to FIG. 5g, an insulating layer 312 is formed over conductive layers 306-310 and insulating layer 298. A conductive via 314 is formed through insulating layer 312 and electrically connected to conductive layer 308. A conductive via 316 is formed through insulating layer 312 and electrically connected to conductive layer 306. A conductive via 318 is formed through insulating layer 312 and electrically connected to conductive layer 310. A conductive layer 320 is formed over insulating layer 312 and electrically connected to conductive via 316 as a source metal 3 layer. A conductive layer 322 is formed over insulating layer 312 and electrically connected to conductive via 314 as a drain metal 3 plane. A conductive layer 324 is formed over insulating layer 312 and electrically connected to conductive via 318 as a drain metal 3 plane.

Figure 5J:
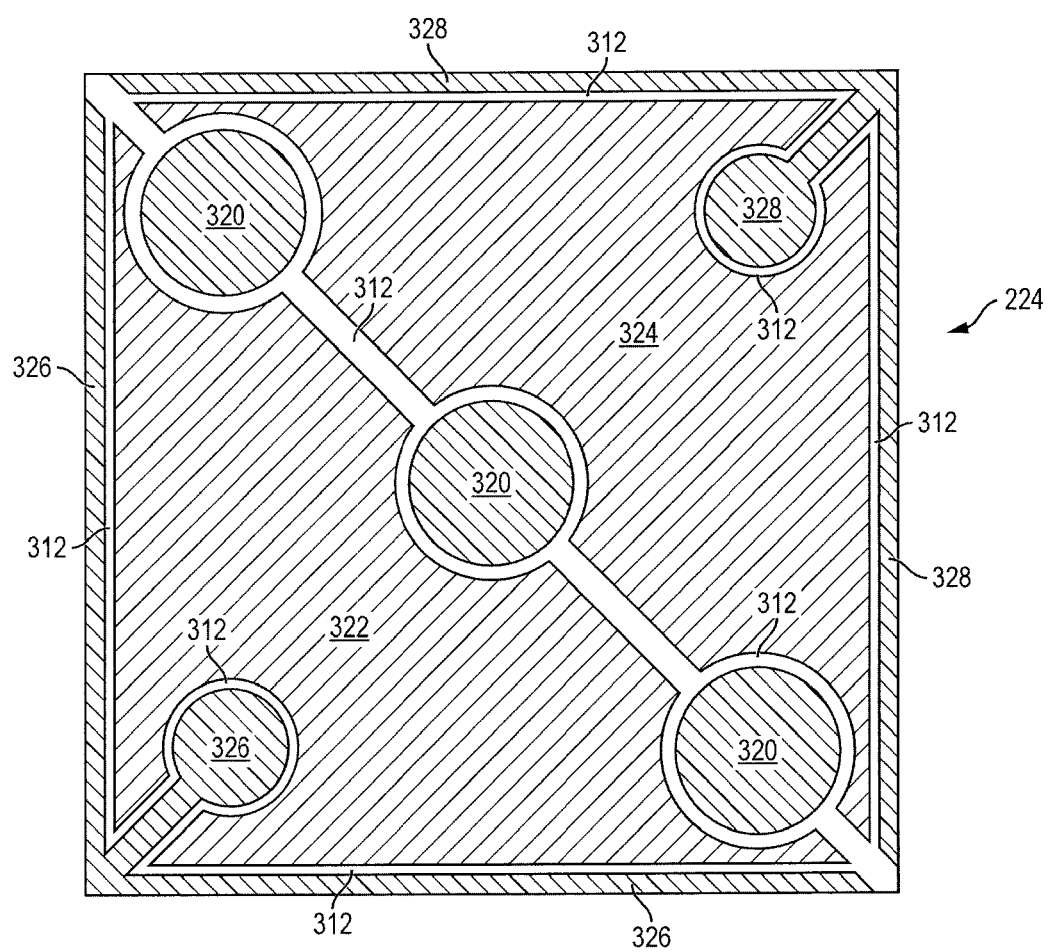

FIG. 5j shows a plan view of source metal 3 layer (conductive layer 320) and drain metal 3 layers (conductive layers 322 and 324) and insulating layer 312. Drain metal 3 layers are arranged as plane structures across semiconductor die 224 to reduce resistance of interconnect structure 290 by distributing current density across the drain metal planes. Current flow is distributed omnidirectional across the drain metal 3 planes to reduce the RDSON of power MOSFET 90. Source metal 3 layer is formed as circular islands within the drain metal 3 planes for vertical interconnect of source contact 278 through the drain metal 3 planes. A conductive layer 326 (not shown in FIG. 5g) is formed as a gate pad over insulating layer 312 electrically connected to gate structure 285. A conductive layer 328 is formed as a gate pad over insulating layer 312 electrically connected to gate structure 286. Conductive layers 326 and 328 extend along a perimeter of semiconductor die 224 to gate structures 285 and 286, respectively. The remainder of the plane structure across semiconductor die 224 is available for source metal 3 layers and drain metal 3 layers.

Returning to FIG. 5g, a passivation or insulating layer 330 is formed over conductive layers 320-324 and insulating layer 312. A portion of insulating layer 330 is removed by etching or LDA to expose conductive layers 320-324. An optional under bump metallization (UBM) layer is formed over the exposed portion of conductive layers 320-324. The UBM layer includes a conductive layer 332 containing Ni with a thickness of 5 μm, and conductive layer 334 containing Au.

An electrically conductive bump material is deposited over the exposed portion of UBM layer 332-334 using an evaporation, electrolytic plating, electroless plating, ball drop, stenciling, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM layer 332-334 using a suitable attachment or bonding process. In one embodiment, the bump material is reflowed by heating the material above its melting point to form balls or bumps 338. In some applications, bumps 338 are reflowed a second time to improve electrical contact to UBM layer 332-334. Bumps 338 can also be compression bonded to UBM layer 332-334. Bumps 338 represent one type of interconnect structure that can be formed over UBM layer 332-334. The interconnect structure can also use stud bump, micro bump, or other electrical interconnect.

Figure 5K:
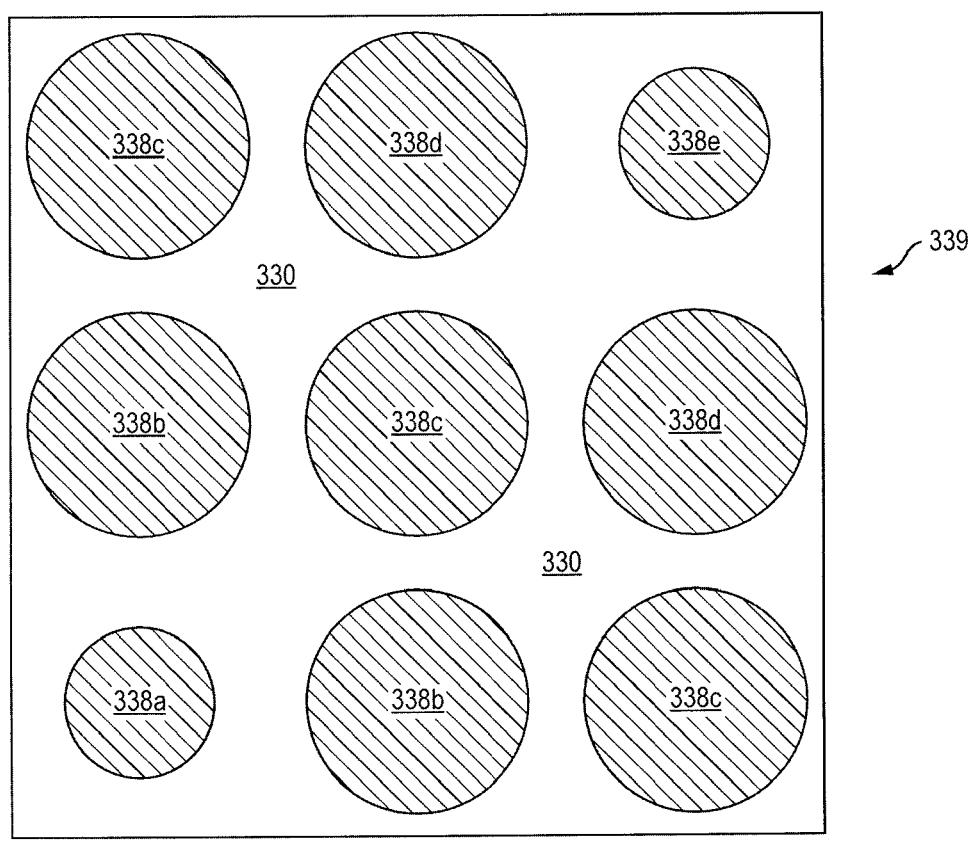

FIG. 5k shows a plan view of LGA semiconductor package 339 containing lateral power MOSFET 90 with bump 338a as a first gate terminal electrically connected to conductive layer 326, bumps 338b as first drain terminals electrically connected to conductive layer 322, bumps 338c as source terminals electrically connected to conductive layer 320, bumps 338d as second drain terminals electrically connected to conductive layer 324, and bump 338e as a second gate terminal electrically connected to conductive layer 328. The size of LGA package 339 ranges from 0.5×0.5 mm to 3.0×3.0 mm. Power MOSFET 90 occupies a substantial portion of the LGA package footprint. Bumps 338b-338d are relatively large diameter 300 μm for lower contact resistance. In addition, the source metal 2 plane (conductive layer 306) reduces resistance of interconnect structure 290 and accordingly the RDSON of power MOSFET 90.

Figure 6A:
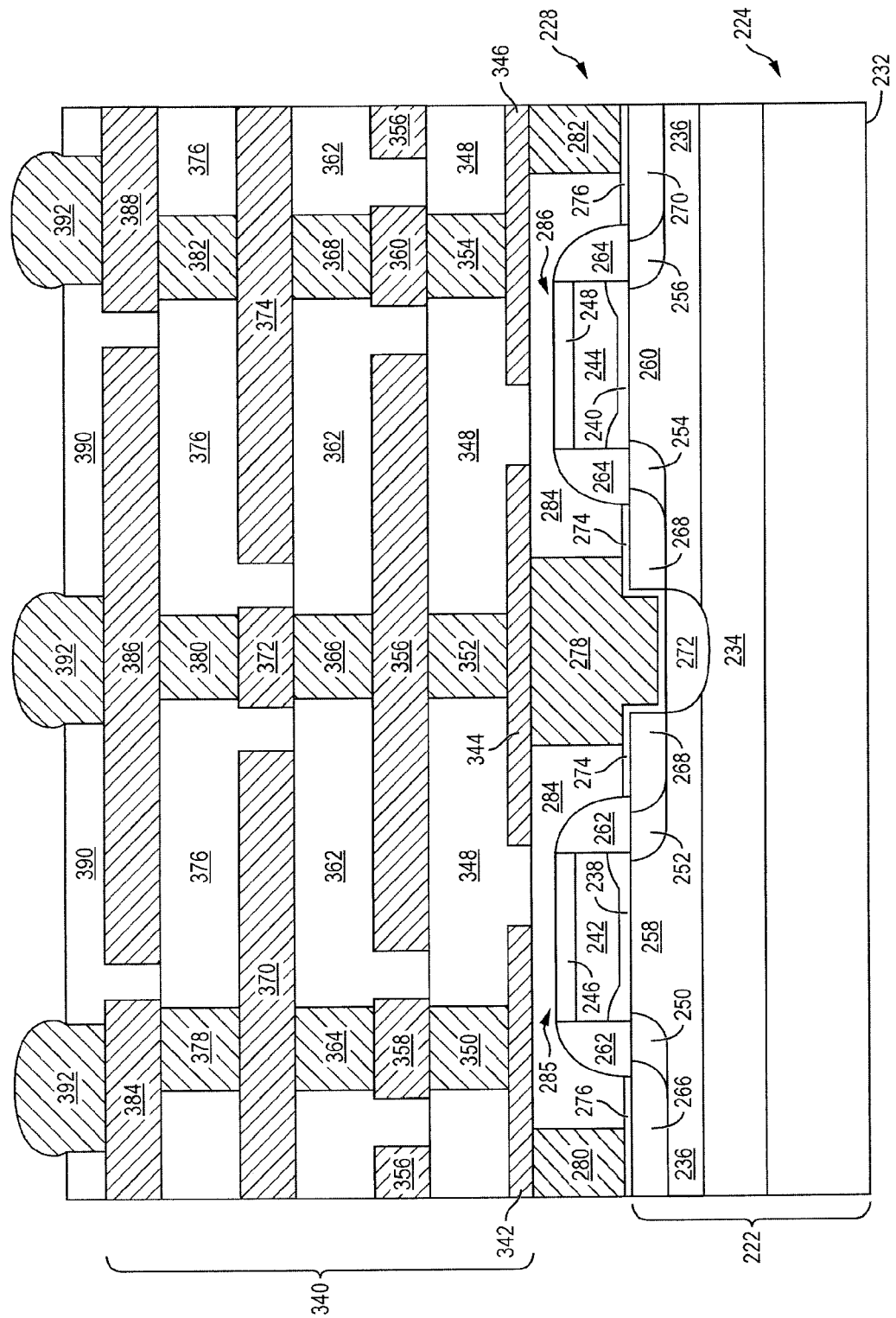
FIGS. 6a-6d illustrate a dual power MOSFET cell with an interconnect structure containing intermediate source plane and drain plane.

In another embodiment, an interconnect structure 340 having multiple alternating source planes and drain planes for MOSFET cells 228 is formed over a dual MOSFET semiconductor die 224. Continuing from FIG. 5e, interconnect structure 340 includes a conductive layer 342 formed over drain contact 280 and insulating layer 284 as a drain metal 1 layer, as shown in FIG. 6a. A conductive layer 344 is formed over source contact 278 and insulating layer 284 as a source metal 1 layer. A conductive layer 346 is formed over drain contact 282 and insulating layer 284 as a drain metal 1 layer. Source metal 1 layer and drain metal 1 layer (conductive layers 342-346) are arranged in an alternating strip pattern, similar to FIG. 5h. The segments of conductive layer 342 are electrically common but electrically isolated from conductive layers 344 and 346. The segments of conductive layer 344 are electrically common but electrically isolated from conductive layers 342 and 346. The segments of conductive layer 346 are electrically common but electrically isolated from conductive layers 342 and 344.

An insulating layer 348 is formed over conductive layers 342-346 and insulating layer 284. A conductive via 350 is formed through insulating layer 348 and electrically connected to conductive layer 342. A conductive via 352 is formed through insulating layer 348 and electrically connected to conductive layer 344. A conductive via 354 is formed through insulating layer 348 and electrically connected to conductive layer 346. A conductive layer 356 is formed over insulating layer 348 and electrically connected to conductive via 352 as a source metal 2 layer. A conductive layer 358 is formed over insulating layer 348 and electrically connected to conductive via 350 as a drain metal 2 layer. A conductive layer 360 is formed over insulating layer 348 and electrically connected to conductive via 354 as a drain metal 2 layer.

Source metal 2 layer (conductive layer 356) is arranged in a plane structure across semiconductor die 224 to reduce resistance of interconnect structure 340 by distributing current density across the source metal plane, similar to FIG. 5i. Current flow is distributed omnidirectional across the source metal 2 plane to reduce the RDSON of power MOSFET 90. Drain metal 2 layers (conductive layers 358 and 360) are formed as islands within the source metal 2 plane for vertical interconnect of drain contacts 280 and 282 through the source metal 2 plane.

An insulating layer 362 is formed over conductive layers 356-360 and insulating layer 348. A conductive via 364 is formed through insulating layer 362 and electrically connected to conductive layer 358. A conductive via 366 is formed through insulating layer 362 and electrically connected to conductive layer 356. A conductive via 368 is formed through insulating layer 362 and electrically connected to conductive layer 360. A conductive layer 370 is formed over insulating layer 362 and electrically connected to conductive via 364 as a drain metal 3 layer. A conductive layer 372 is formed over insulating layer 362 and electrically connected to conductive via 366 as a source metal 3 layer. A conductive layer 374 is formed over insulating layer 362 and electrically connected to conductive via 368 as a drain metal 3 layer.

Figure 6B:
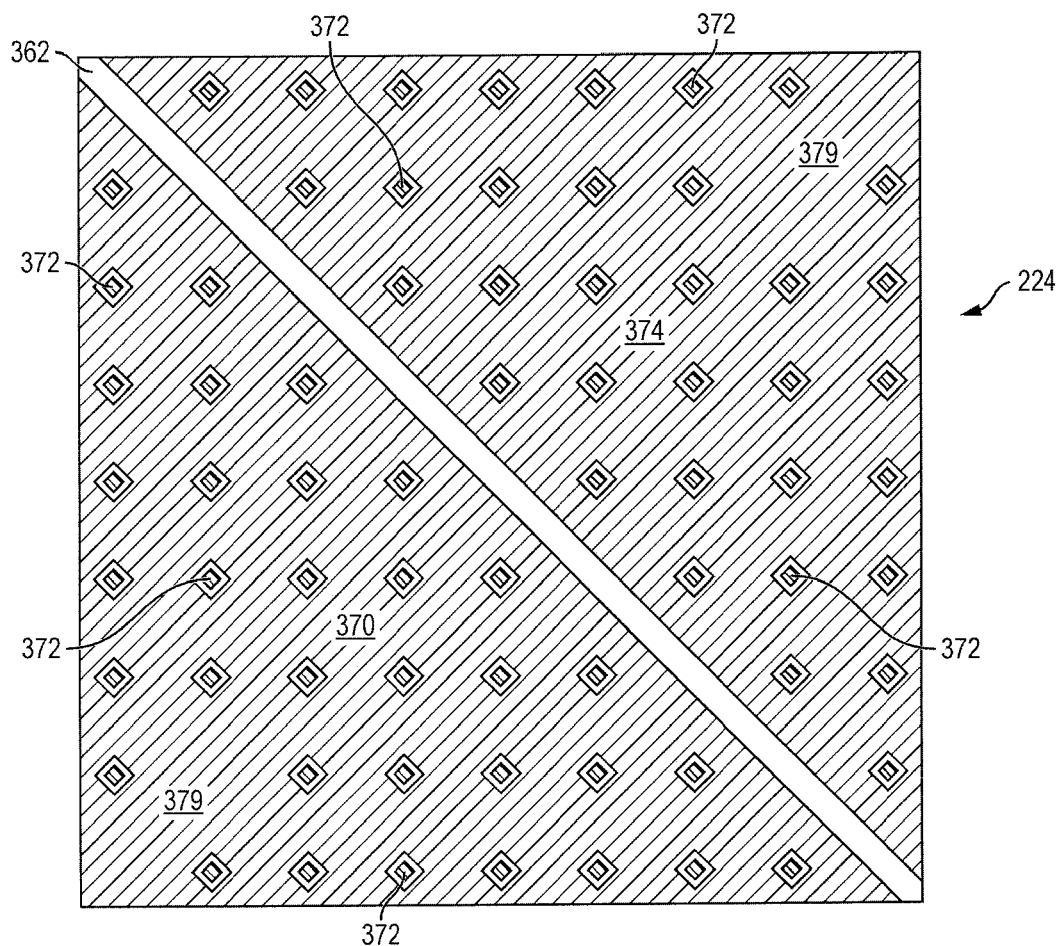

FIG. 6b shows a plan view of drain metal 3 layers (conductive layers 370 and 374) arranged in plane structures across semiconductor die 224 to reduce resistance of interconnect structure 340 by distributing current density across the drain metal planes. Current flow is distributed omnidirectional across the drain metal 3 plane to reduce the RDSON of power MOSFET 90. Source metal 3 layer (conductive layer 372) is formed as islands within the drain metal 3 planes for vertical interconnect of source contact 378 through the drain metal 3 planes. In one embodiment, there are no source islands formed in relatively small areas 379. The remainder of the plane structure across semiconductor die 224 is available for source metal 3 layers and drain metal 3 layers.

Returning to FIG. 6a, an insulating layer 376 is formed over conductive layers 370-374 and insulating layer 362. A conductive via 378 is formed through insulating layer 376 and electrically connected to conductive layer 370. A conductive via 380 is formed through insulating layer 376 and electrically connected to conductive layer 372. A conductive via 382 is formed through insulating layer 376 and electrically connected to conductive layer 374. A conductive layer 384 is formed over insulating layer 376 and electrically connected to conductive via 378 as a drain metal 4 layer. A conductive layer 386 is formed over insulating layer 376 and electrically connected to conductive via 380 as a source metal 4 layer. A conductive layer 388 is formed over insulating layer 376 and electrically connected to conductive via 382 as a drain metal 4 layer. Conductive vias 352, 366, and 380 are shown for completeness but can be disposed in a different vertical plane than conductive vias 350, 354, 364, 368, 378, and 382.

Figure 6C:
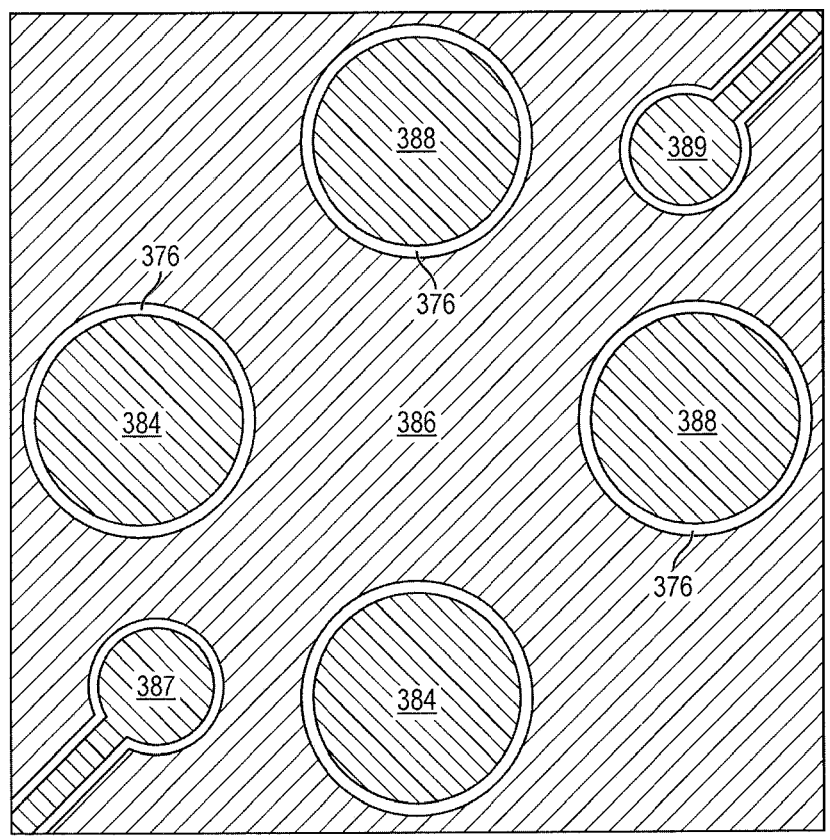

FIG. 6c shows a plan view of source metal 4 layer (conductive layer 386) and drain metal 4 layers (conductive layers 384 and 388) and insulating layer 376. Source metal 4 layer is arranged in a plane structure separate across semiconductor die 224 to reduce resistance of interconnect structure 340 by distributing current density across the source metal plane. Current flow is distributed omnidirectional across the source metal 4 plane to reduce the RDSON of power MOSFET 90. Drain metal 4 layers are formed as circular islands within the source metal 4 plane for vertical interconnect of drain contact 280 and 282 through the source metal 4 plane. A conductive layer 387 is formed as a gate pad over insulating layer 376 electrically connected to gate structure 285 along a perimeter of semiconductor die 224 to gate structure 285, similar to FIG. 5j. A conductive layer 389 is formed as a gate pad over insulating layer 376 electrically connected to gate structure 286 along a perimeter of semiconductor die 224 to gate structure 286. The remainder of the plane structure across semiconductor die 224 is available for source metal 4 layers and drain metal 4 layers.

Returning to FIG. 6a, a passivation or insulating layer 390 is formed over conductive layers 384-388 and insulating layer 376. A portion of insulating layer 390 is removed by etching or LDA to expose conductive layers 384-388. An optional UBM layer can be formed over the exposed portion of conductive layers 384-388, similar to conductive layers 332-334 in FIG. 5g. An electrically conductive bump material is deposited over the exposed portion of conductive layers 384-388 using an evaporation, electrolytic plating, electroless plating, ball drop, stenciling, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 384-388 using a suitable attachment or bonding process. In one embodiment, the bump material is reflowed by heating the material above its melting point to form balls or bumps 392. In some applications, bumps 392 are reflowed a second time to improve electrical contact to conductive layers 384-388. Bumps 392 can also be compression bonded to conductive layers 384-388. Bumps 392 represent one type of interconnect structure that can be formed over conductive layers 384-388. The interconnect structure can also use stud bump, micro bump, or other electrical interconnect.

Figure 6D:
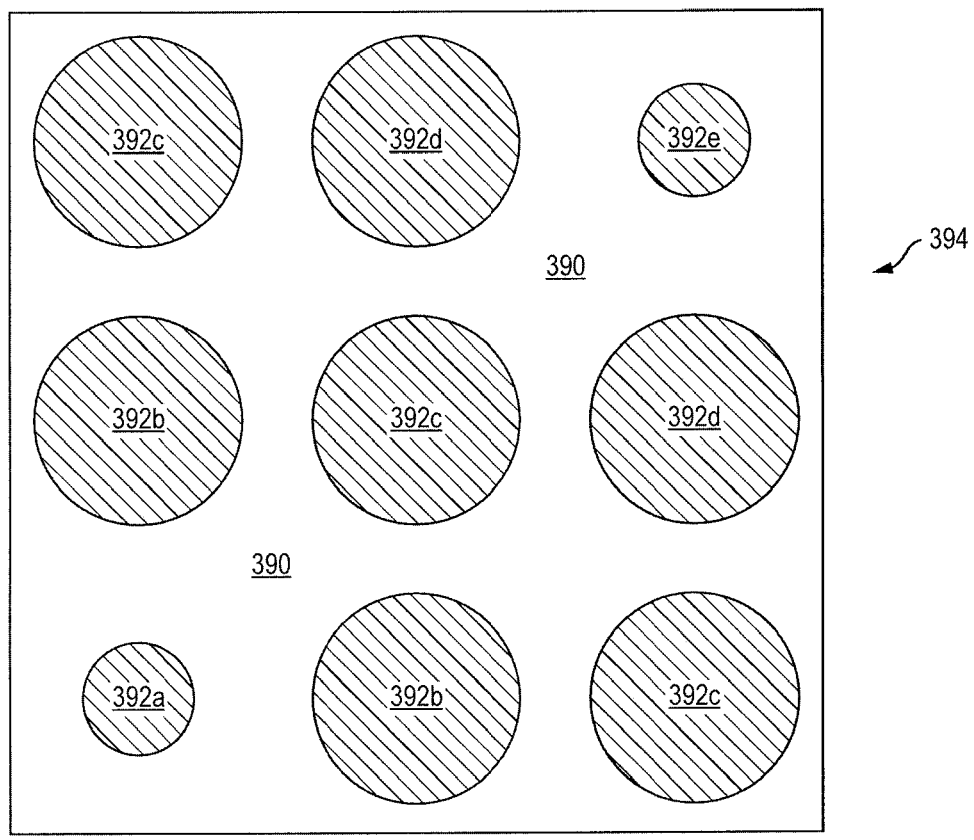

FIG. 6d shows a plan view of LGA semiconductor package 394 containing lateral power MOSFET 90 with bump 392a as a first gate terminal electrically connected to conductive layer 387, bumps 392b as first drain terminals electrically connected to conductive layer 384, bumps 392c as source terminals electrically connected to conductive layer 386, bumps 392d as second drain terminals electrically connected to conductive layer 388, and bump 392e as a second gate terminal electrically connected to conductive layer 389. The size of LGA semiconductor package 394 ranges from 0.5×0.5 mm to 3.0×3.0 mm. Power MOSFET 90 occupies a substantial portion of the LGA package footprint. Bumps 392b-392d are relatively large diameter 300 μm for lower contact resistance. In addition, the source metal 2 plane and drain metal 3 plane reduce resistance of interconnect structure 340 and accordingly the RDSON of power MOSFET 90.

Figure 7A:
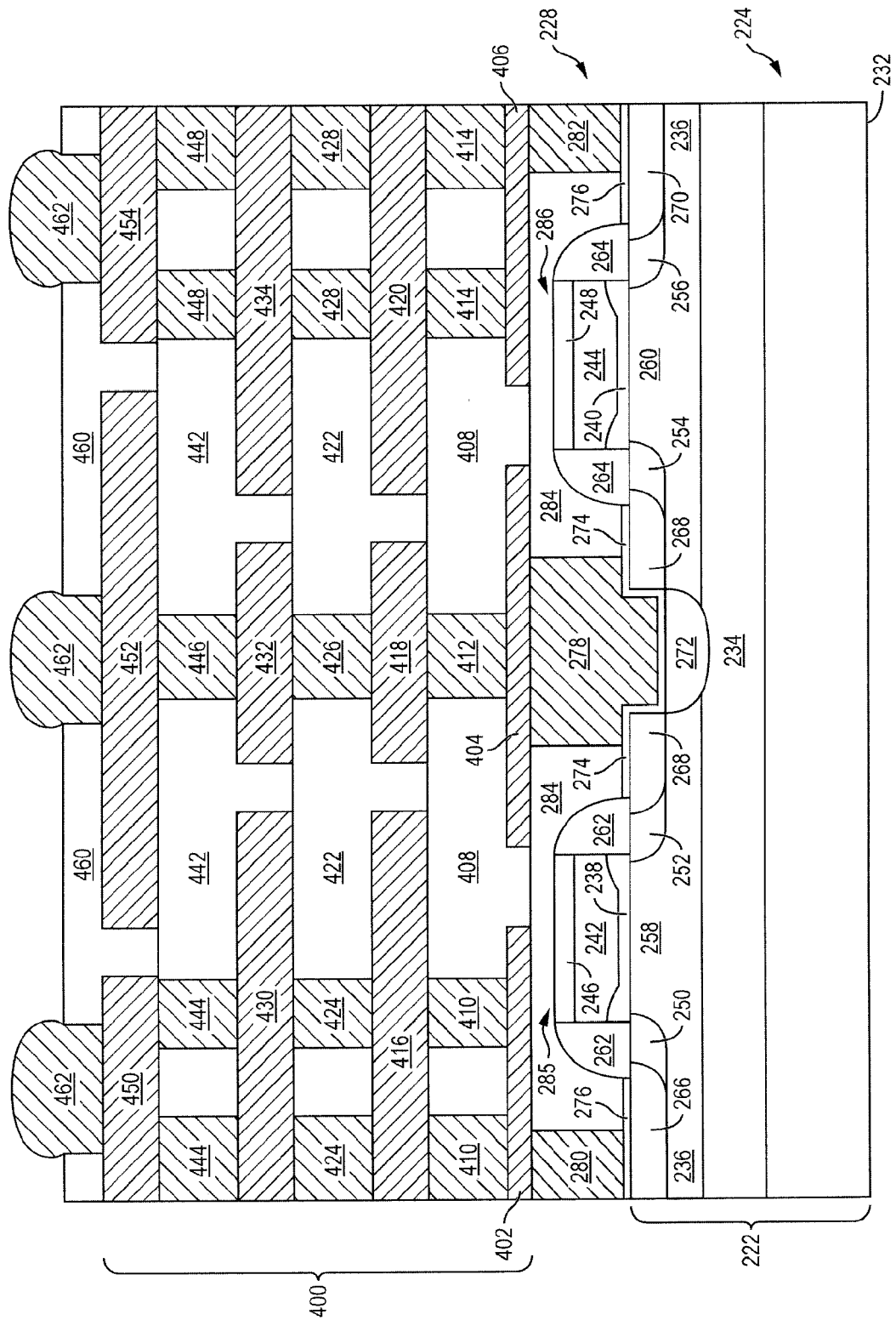
FIGS. 7a-7d illustrate a dual power MOSFET cell with an interconnect structure containing stacked intermediate conductive layers.

In another embodiment, an interconnect structure 400 having alternating source strips and drain strips for MOSFET cells 228 is formed over a dual MOSFET semiconductor die 224. Continuing from FIG. 5e, interconnect structure 400 includes a conductive layer 402 formed over drain contact 280 and insulating layer 284 as a drain metal 1 layer, as shown in FIG. 7a. A conductive layer 404 is formed over source contact 278 and insulating layer 284 as a source metal 1 layer. A conductive layer 406 is formed over drain contact 282 and insulating layer 284 as a drain metal 1 layer. Source metal 1 layer and drain metal 1 layers (conductive layers 402-406) are arranged in an alternating strip pattern, similar to FIG. 5h. The segments of conductive layer 402 are electrically common but electrically isolated from conductive layers 404 and 406. The segments of conductive layer 404 are electrically common but electrically isolated from conductive layers 402 and 406. The segments of conductive layer 406 are electrically common but electrically isolated from conductive layers 402 and 404.

An insulating layer 408 is formed over conductive layers 402-406 and insulating layer 284. Conductive vias 410 are formed through insulating layer 408 and electrically connected to conductive layer 402. A conductive via 412 is formed through insulating layer 408 and electrically connected to conductive layer 404. Conductive vias 414 are formed through insulating layer 408 and electrically connected to conductive layer 406. A conductive layer 416 is formed over insulating layer 408 and electrically connected to conductive vias 410 as a drain metal 2 layer. A conductive layer 418 is formed over insulating layer 408 and electrically connected to conductive via 412 as a source metal 2 layer. A conductive layer 420 is formed over insulating layer 408 and electrically connected to conductive vias 414 as a drain metal 2 layer.

An insulating layer 422 is formed over conductive layers 416-420 and insulating layer 408. Conductive vias 424 are formed through insulating layer 422 and electrically connected to conductive layer 416. A conductive via 426 is formed through insulating layer 422 and electrically connected to conductive layer 418. Conductive vias 428 are formed through insulating layer 422 and electrically connected to conductive layer 420. A conductive layer 430 is formed over insulating layer 422 and electrically connected to conductive vias 424 as a drain metal 3 layer. A conductive layer 432 is formed over insulating layer 422 and electrically connected to conductive via 426 as a source metal 3 layer. A conductive layer 434 is formed over insulating layer 422 and electrically connected to conductive vias 428 as a drain metal 3 layer.

Drain metal 2 layer (conductive layer 416) and drain metal 3 layer (conductive layer 430) are stacked and electrically common to increase the effective thickness of the intermediate conductive layers. Source metal 2 layer (conductive layer 418) and source metal 3 layer (conductive layer 432) are stacked and electrically common to increase the effective thickness of the intermediate conductive layers. Drain metal 2 layer (conductive layer 420) and drain metal 3 layer (conductive layer 434) are stacked and electrically common to increase the effective thickness of the intermediate conductive layers. In one embodiment, the overall thickness of source metal 2 layer and source metal 3 layer, and correspondingly drain metal 2 layers and drain metal 3 layers, is 4 μm. The stacked intermediate conductive layers 416-420 and 430-434 reduce resistance of interconnect structure 400 and accordingly the RDSON of power MOSFET 90.

Figure 7B:
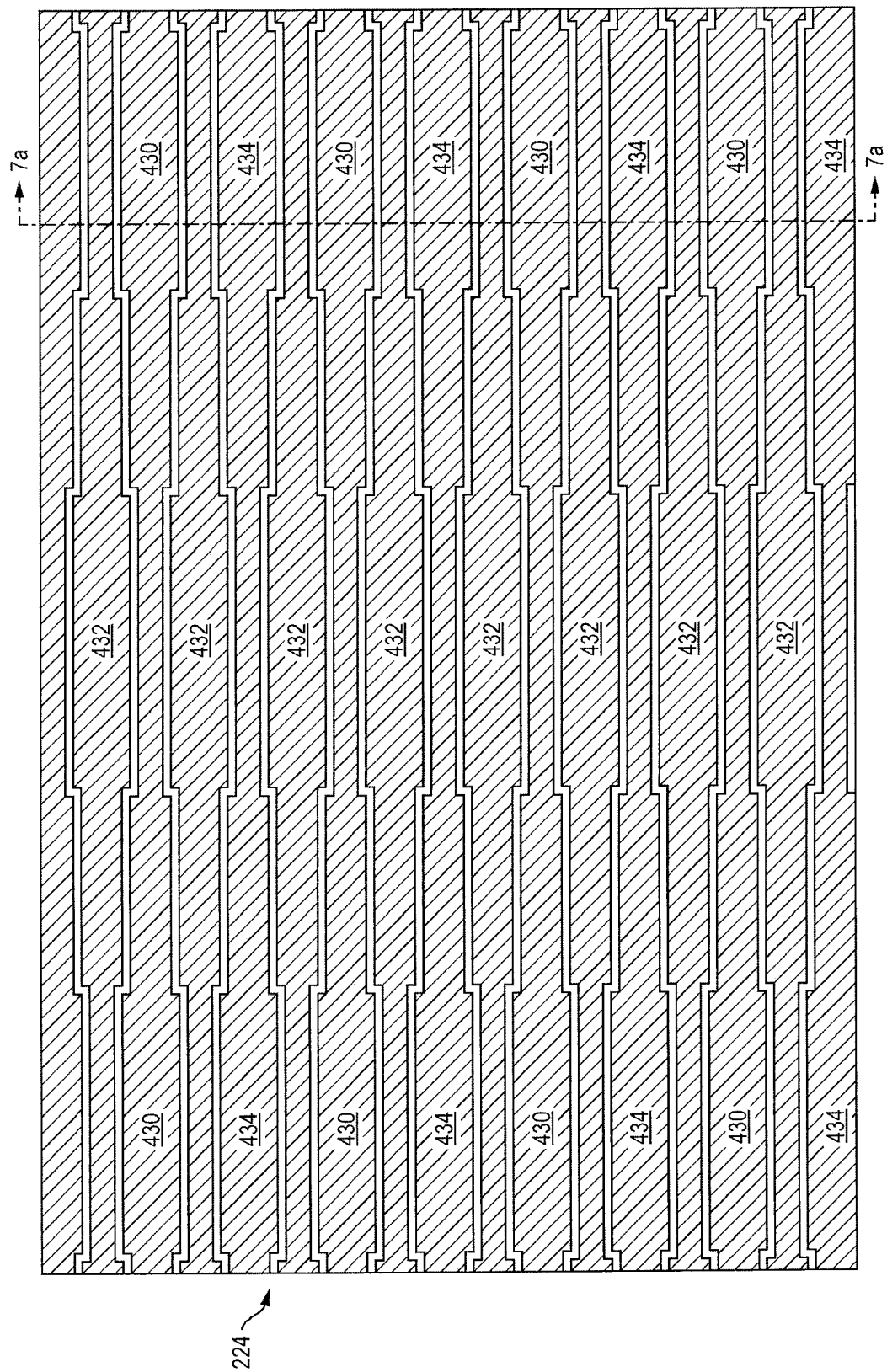

Conductive layers 416-420 and 430-434 are arranged in an alternating strip pattern that extends into the page of FIG. 7a. FIG. 7b shows a plan view of conductive layers 430-434 arranged in the alternating strip pattern. Conductive layers 416-420 have the same alternating strip pattern disposed under conductive layers 430-434. Current flow is uni-directional along the conductive strips. Conductive layers 430 and 434 are shown wider than conductive layer 432 along line 7a-7a of FIG. 7b, i.e., under the drain terminal where drain current density is higher. Conductive layer 432 is shown wider than conductive layers 430 and 434 under the source terminal where source current density is higher.

Returning to FIG. 7a, an insulating layer 442 is formed over conductive layers 430-434 and insulating layer 422. Conductive vias 444 are formed through insulating layer 442 and electrically connected to conductive layer 430. A conductive via 446 is formed through insulating layer 442 and electrically connected to conductive layer 432. Conductive vias 448 are formed through insulating layer 442 and electrically connected to conductive layer 434.

A conductive layer 450 is formed over insulating layer 442 and electrically connected to conductive vias 444 as a drain metal 4 layer. A conductive layer 452 is formed over insulating layer 442 and electrically connected to conductive via 446 as a source metal 4 layer. A conductive layer 454 is formed over insulating layer 442 and electrically connected to conductive vias 448 as a drain metal 4 layer. Conductive vias 412, 426, and 446 are shown for completeness but can be disposed in a different vertical plane than conductive vias 410, 414, 424, 428, 444, and 448.

Figure 7C:
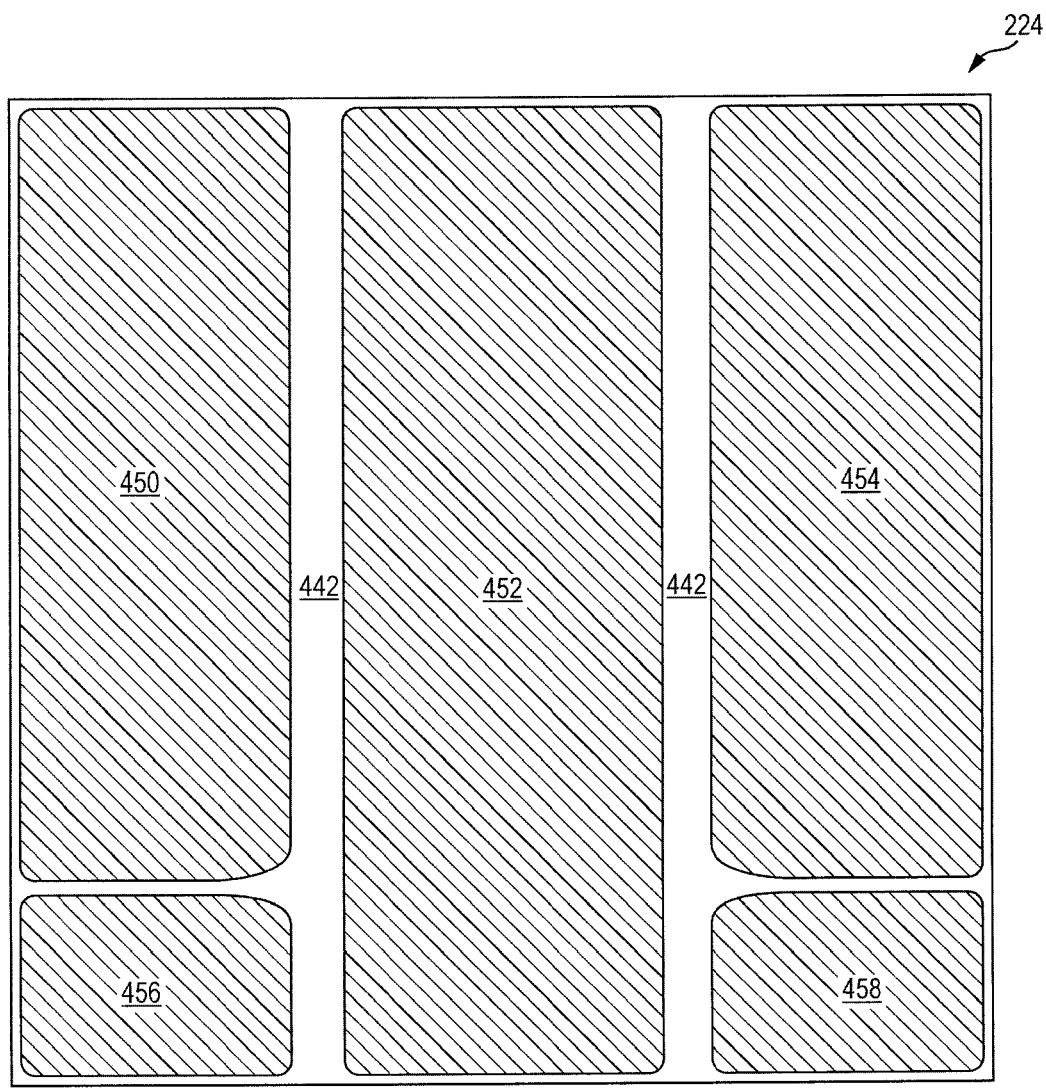

FIG. 7c shows a plan view of conductive layers 450-454 and insulating layer 442. Conductive layers 456 and 458 (not shown in FIG. 7a) are formed over insulating layer 442 and electrically connected to gate structures 285 and 286, respectively.

Returning to FIG. 7a, a passivation or insulating layer 460 is formed over conductive layers 450-454 and insulating layer 442. A portion of insulating layer 460 is removed by etching or LDA to expose conductive layers 450-454. An optional UBM layer can be formed over the exposed portion of conductive layers 450-454, similar to conductive layers 332-334 in FIG. 5g. An electrically conductive bump material is deposited over the exposed portion of conductive layers 450-454 using an evaporation, electrolytic plating, electroless plating, ball drop, stenciling, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 450-454 using a suitable attachment or bonding process. In one embodiment, the bump material is reflowed by heating the material above its melting point to form balls or bumps 462. In some applications, bumps 462 are reflowed a second time to improve electrical contact to conductive layers 450-454. Bumps 462 can also be compression bonded to conductive layers 450-454. Bumps 462 represent one type of interconnect structure that can be formed over conductive layers 450-454. The interconnect structure can also use stud bump, micro bump, or other electrical interconnect.

Figure 7D:
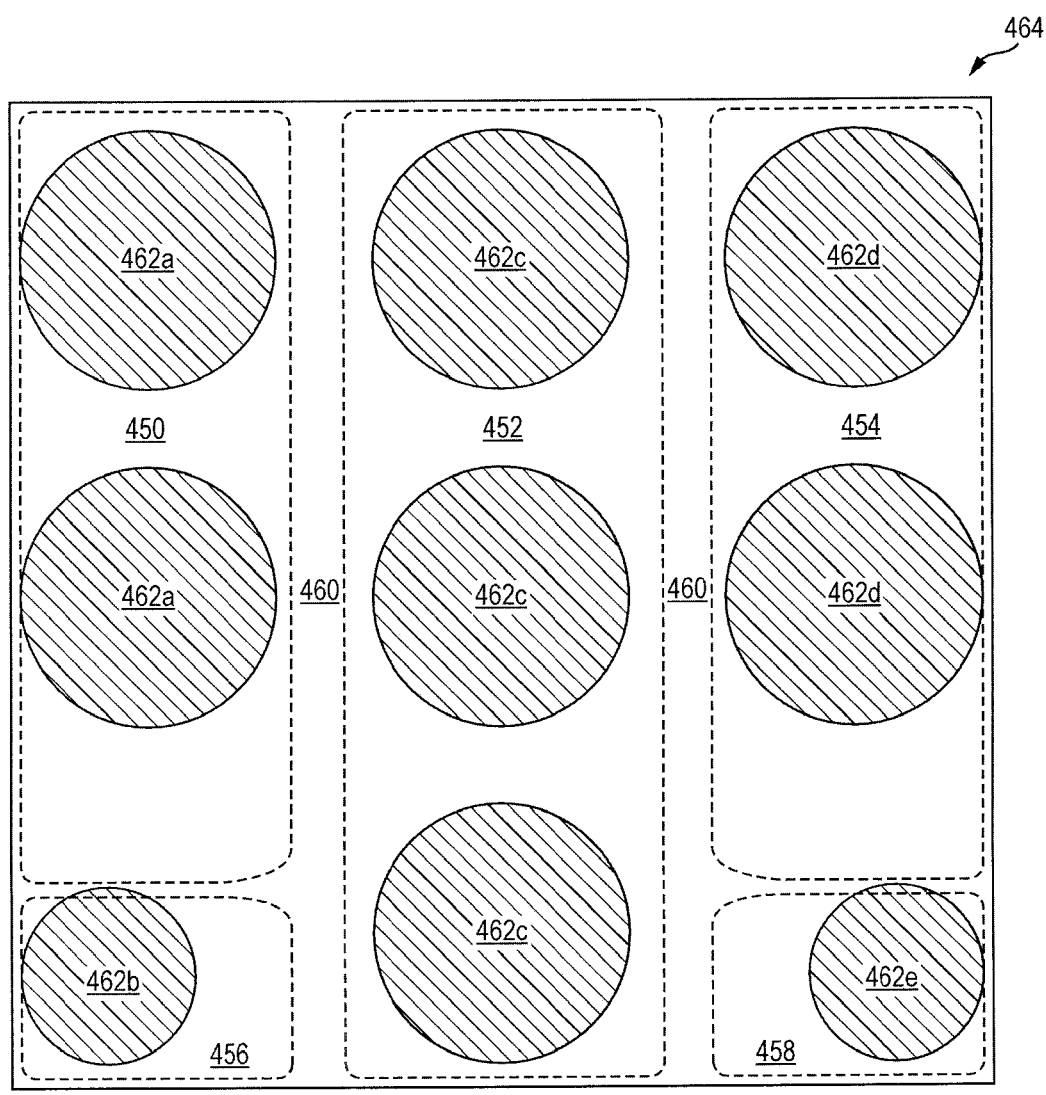

FIG. 7d shows a plan view of LGA semiconductor package 464 containing lateral power MOSFET 90 with bumps 462a as first drain terminals electrically connected to conductive layer 450, bump 462b as a first gate terminal electrically connected to conductive layer 456, bumps 462c as source terminals electrically connected to conductive layer 452, bumps 462d as second drain terminals electrically connected to conductive layer 454, and bump 462e as a second gate terminal electrically connected to conductive layer 458. The size of LGA package 464 ranges from 0.5×0.5 mm to 3.0×3.0 mm. Power MOSFET 90 occupies a substantial portion of the LGA package footprint. Bumps 462a, 462c, and 462d are relatively large diameter 300 μm for lower contact resistance. In addition, the multiple layers and effective thickness of source metal 2 layer (conductive layer 418) and source metal 3 layer (conductive layer 432), and the multiple layers effective thickness of drain metal 2 layer (conductive layers 416 and 420) and drain metal 3 layer (conductive layers 430 and 434), reduce resistance of interconnect structure 400 and accordingly the RDSON of power MOSFET 90.

Figure 8A:
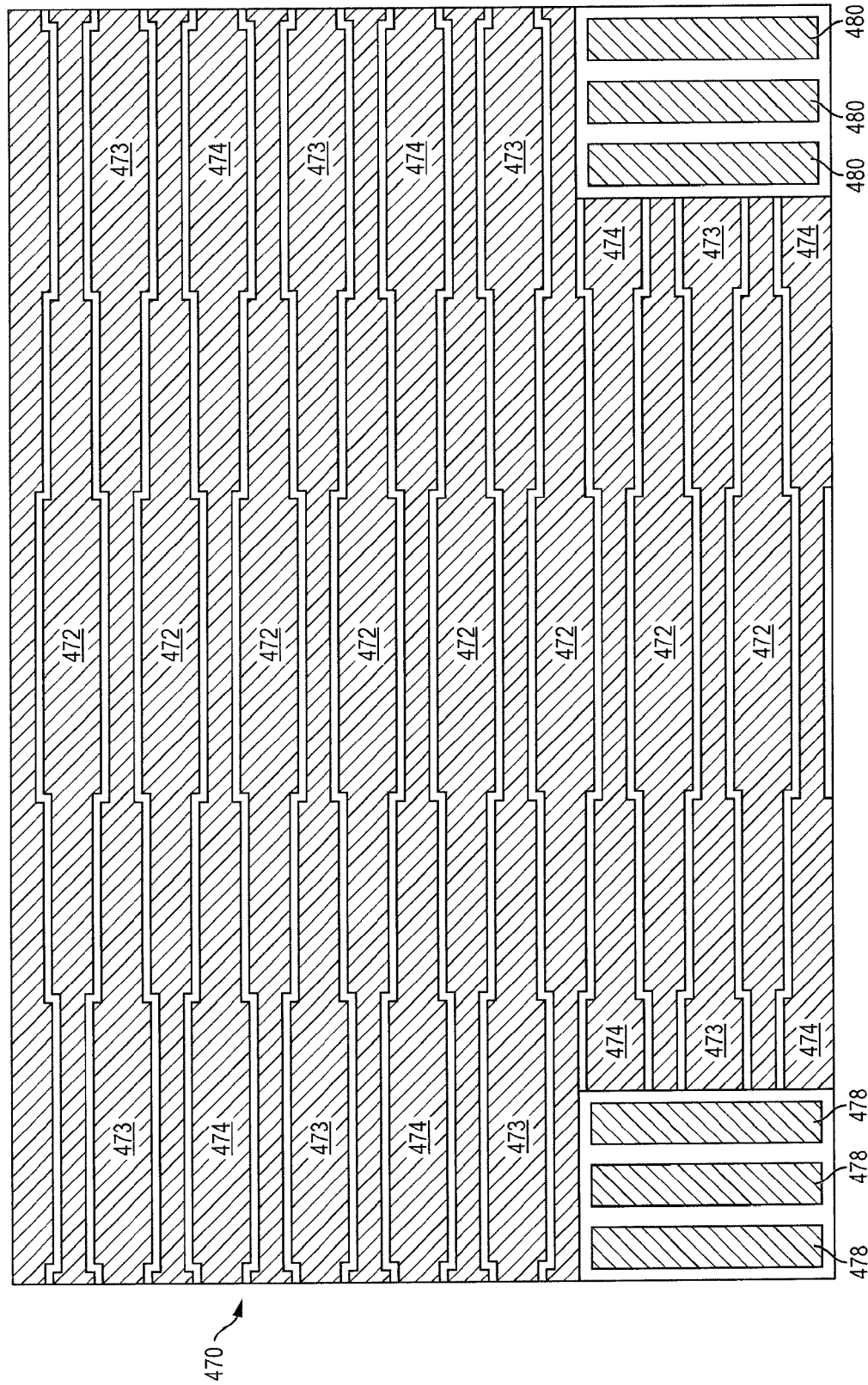
FIGS. 8a-8c illustrate a dual power MOSFET cell with an interconnect structure containing intermediate drain layers disposed under the gate terminal.

FIG. 8a shows another embodiment of a portion of the interconnect structure formed over substrate 222, similar to FIGS. 7a-7d. In particular, interconnect structure 470 includes source metal 3 layer (conductive layer 472) and drain metal 3 layers (conductive layers 473 and 474) disposed in an alternating strip pattern extending in the x direction, similar to FIG. 7b. Drain metal 3 layer also includes conductive layers 478 and 480 disposed in an area under the later-formed gate terminals. Conductive layers 478 and 480 extend in the y direction, perpendicular to conductive layers 472-474.

Figure 8B:
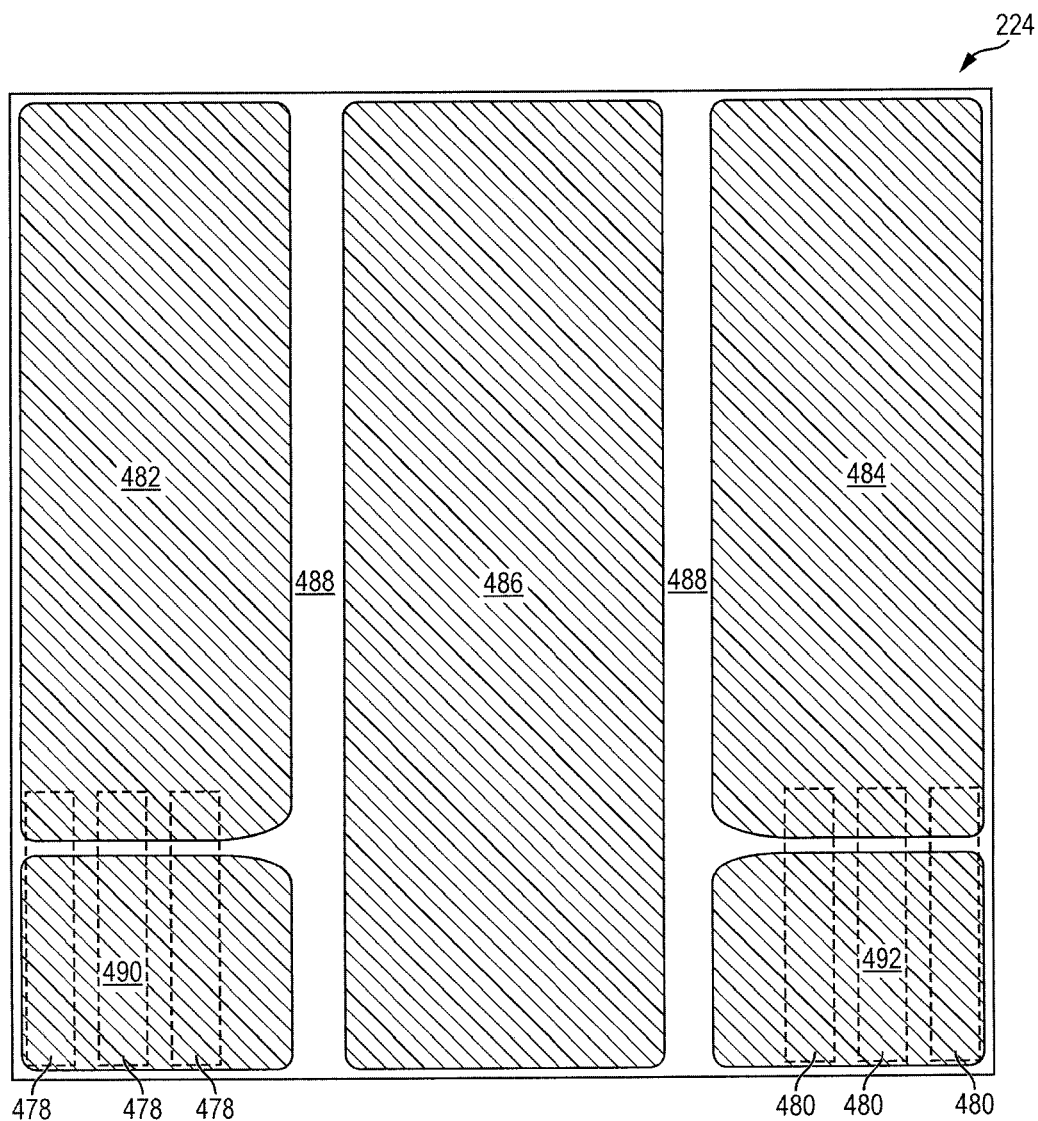

FIG. 8b shows a plan view of drain metal 4 layer (conductive layers 482 and 484) and source metal 4 layer (conductive layer 486) formed over insulating layer 488 for interconnect structure 470. Conductive layer 490 is electrically connected to gate structure 285. Conductive layer 492 is electrically connected to gate structure 286. Conductive layers 478 and 480 extend under conductive layers 490 and 492, respectively, to route drain current from under the gate terminals (conductive layers 490 and 492) to conductive layers 482 and 484 in order to reduce the RDSON of power MOSFET 90. Conductive layers 478 and 480 are electrically connected to conductive layers 482 and 484 with vertical conductive vias.

Figure 8C:
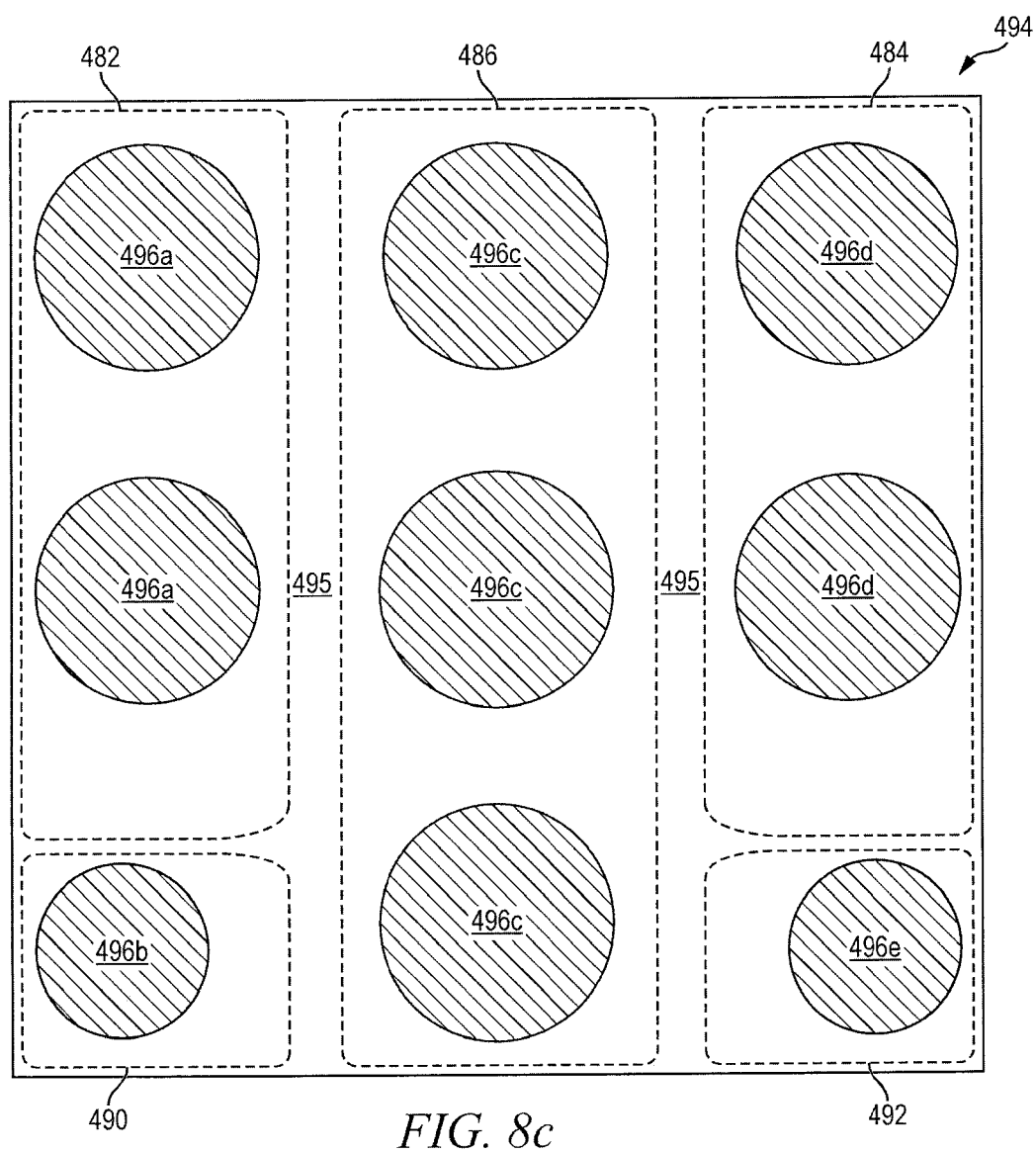

FIG. 8c shows a plan view of LGA semiconductor package 494 containing lateral power MOSFET 90. A passivation layer 495 is formed over conductive layers 478-486 and insulating layer 488. Bumps 496 are formed over passivation layer 495 and conductive layers 478-486. Bumps 496a are first drain terminals electrically connected to conductive layer 482, bump 496b is a first gate terminal electrically connected to conductive layer 490, bumps 496c are source terminals electrically connected to conductive layer 486, bumps 496d are second drain terminals electrically connected to conductive layer 484, and bump 496e is a second gate terminal electrically connected to conductive layer 492. The size of LGA package 494 ranges from 0.5×0.5 mm to 3.0×3.0 mm. The drain metal 3 layer (conductive layers 478 and 480) routed under the gate terminal reduces resistance of interconnect structure 470 and accordingly the RDSON of power MOSFET 90.

A source metal 2 plane can extend under the gate terminal, as shown in FIGS. 5i-5k, to reduce the resistance of the interconnect structure. Likewise, drain metal 3 plane can extend under the gate terminal, as shown in FIGS. 6b-6d, to reduce the resistance of the interconnect structure.

Figure 9A:
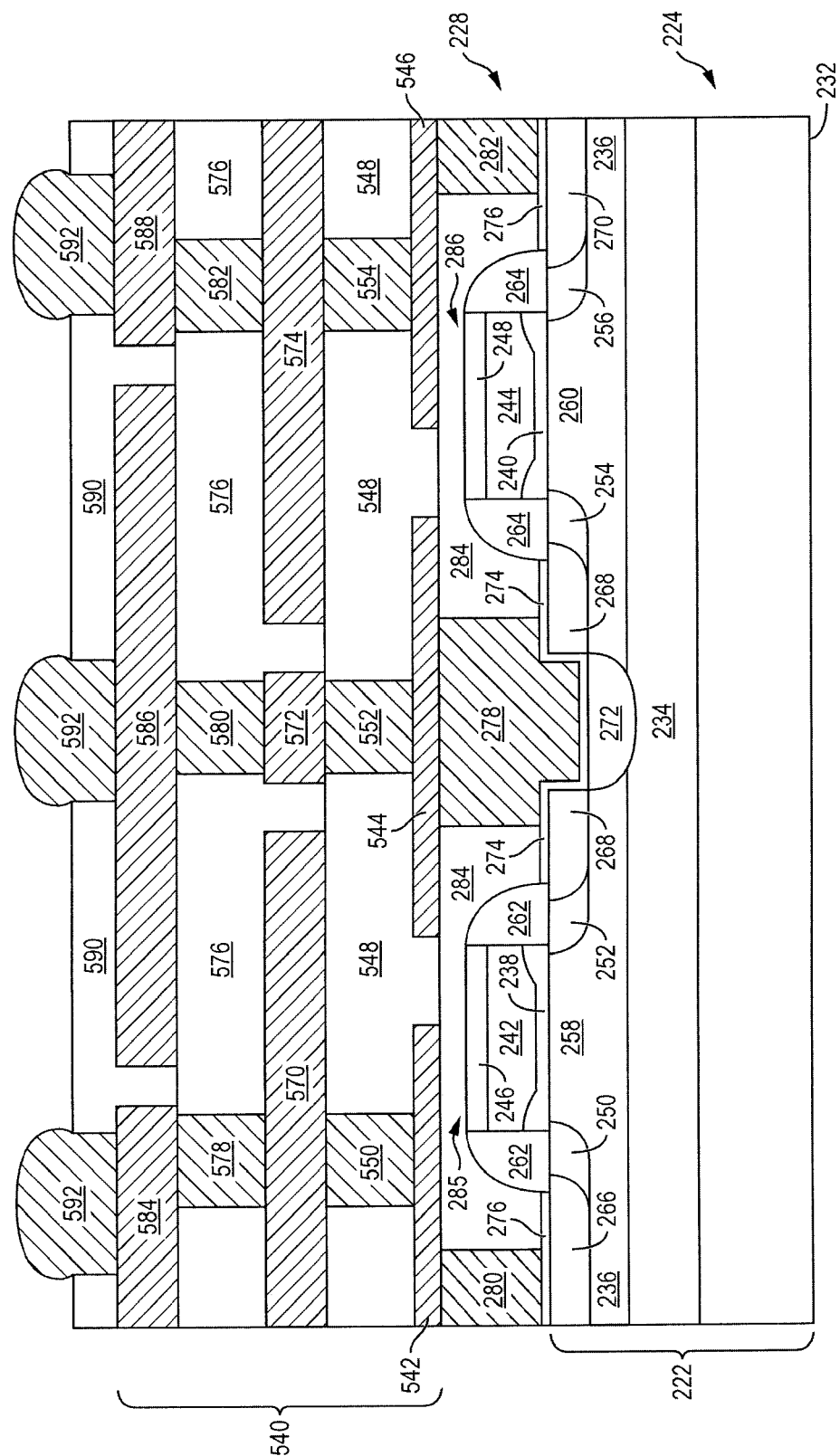
FIGS. 9a-9d illustrate a dual power MOSFET cell with an interconnect structure containing an intermediate source plane and drain plane.

In another embodiment, an interconnect structure 540 having a source plane with drain islands for MOSFET cells 228 is formed over a dual MOSFET semiconductor die 224. Continuing from FIG. 5e, interconnect structure 540 includes a conductive layer 542 formed over drain contact 280 and insulating layer 284 as a drain metal 1 layer, as shown in FIG. 9a. A conductive layer 544 is formed over source contact 278 and insulating layer 284 as a source metal 1 layer. A conductive layer 546 is formed over drain contact 282 and insulating layer 284 as a drain metal 1 layer. Source metal 1 layer and drain metal 1 layer (conductive layers 542-546) are arranged in an alternating strip pattern, similar to FIG. 5h. The segments of conductive layer 542 are electrically common but electrically isolated from conductive layers 544 and 546. The segments of conductive layer 544 are electrically common but electrically isolated from conductive layers 542 and 546. The segments of conductive layer 546 are electrically common but electrically isolated from conductive layers 542 and 544.

An insulating layer 548 is formed over conductive layers 542-546 and insulating layer 284. A conductive via 550 is formed through insulating layer 548 and electrically connected to conductive layer 542. A conductive via 552 is formed through insulating layer 548 and electrically connected to conductive layer 544. A conductive via 554 is formed through insulating layer 548 and electrically connected to conductive layer 546. A conductive layer 570 is formed over insulating layer 548 and electrically connected to conductive via 550 as a drain metal 2 layer. A conductive layer 572 is formed over insulating layer 548 and electrically connected to conductive via 552 as a source metal 2 layer. A conductive layer 574 is formed over insulating layer 548 and electrically connected to conductive via 554 as a drain metal 2 layer.

Figure 9B:
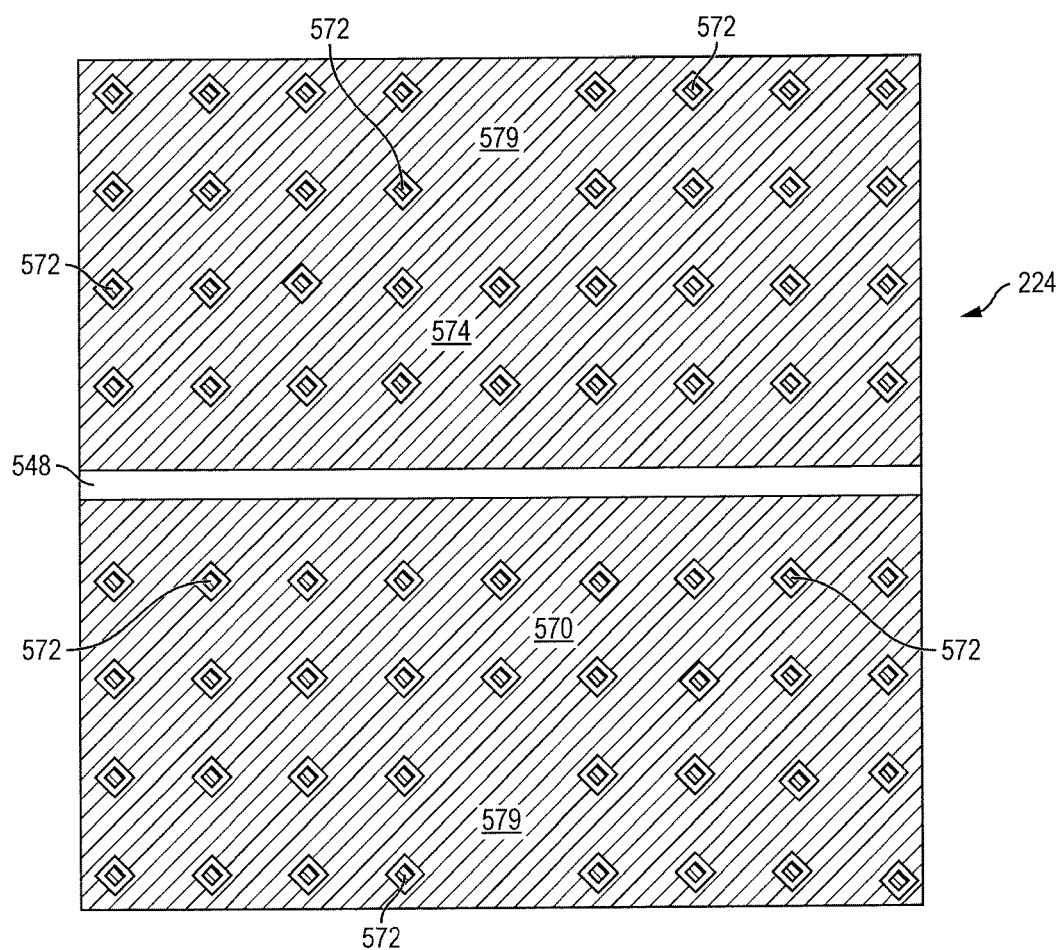

FIG. 9b shows a plan view of drain metal 2 layers (conductive layers 570 and 574) arranged in plane structures across semiconductor die 224 to reduce resistance of interconnect structure 540 by distributing current density across the drain metal planes. Current flow is distributed omnidirectional across the drain metal 2 plane to reduce the RDSON of power MOSFET 90. Source metal 2 layer (conductive layer 572) is formed as islands within the drain metal 2 planes for vertical interconnect of drain contacts 280 and 282 for vertical interconnect of source contacts 278 through the drain metal 2 planes. In one embodiment, there are no source islands formed in relatively small areas 579.

The remainder of the plane structure across semiconductor die 224 is available for source metal 2 layers and drain metal 2 layers.

Returning to FIG. 9a, an insulating layer 576 is formed over conductive layers 570-574 and insulating layer 548. A conductive via 578 is formed through insulating layer 576 and electrically connected to conductive layer 570. A conductive via 580 is formed through insulating layer 576 and electrically connected to conductive layer 572. A conductive via 582 is formed through insulating layer 576 and electrically connected to conductive layer 574. A conductive layer 584 is formed over insulating layer 576 and electrically connected to conductive via 578 as a drain metal 3 layer. A conductive layer 586 is formed over insulating layer 576 and electrically connected to conductive via 580 as a source metal 3 layer. A conductive layer 588 is formed over insulating layer 576 and electrically connected to conductive via 582 as a drain metal 3 layer. Conductive vias 552 and 580 are shown for completeness but can be disposed in a different vertical plane than conductive vias 550, 554, 578, and 582.

Figure 9C:
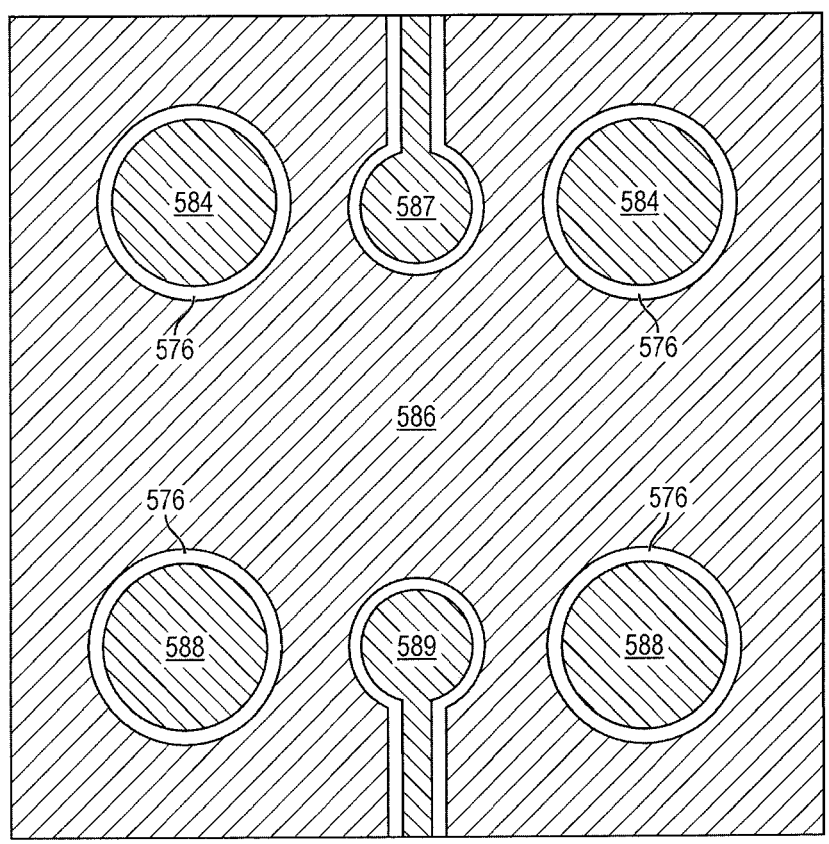

Source metal 3 layer (conductive layer 586) is arranged in a plane structure separate across semiconductor die 224 to reduce resistance of interconnect structure 540 by distributing current density across the source metal plane, as shown in FIG. 9c. Current flow is distributed omnidirectional across the source metal 3 plane to reduce the RDSON of power MOSFET 90. Drain metal 3 layers (conductive layers 584 and 588) are formed as circular islands within the source metal 3 plane for vertical interconnect of drain contacts 280 and 282 through the source metal 3 plane. A conductive layer 587 is formed as a gate pad over insulating layer 576 along a perimeter of semiconductor die 224 and electrically connected to gate structure 285, similar to FIG. 5j. A conductive layer 589 is formed as a gate pad over insulating layer 576 along a perimeter of semiconductor die 224 and electrically connected to gate structure 286. In one embodiment, the circular islands of the drain metal 3 layers have a width of 290 micrometers (μm), and the gate pads (conductive layers 587 and 589) have a width of 170 μm.

Returning to FIG. 9a, a passivation or insulating layer 590 is formed over conductive layers 584-588 and insulating layer 576. A portion of insulating layer 590 is removed by etching or LDA to expose conductive layers 584-588. An optional UBM layer can be formed over the exposed portion of conductive layers 584-588, similar to conductive layers 332-334 in FIG. 5g. An electrically conductive bump material is deposited over the exposed portion of conductive layers 584-588 using an evaporation, electrolytic plating, electroless plating, ball drop, stenciling, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 584-588 using a suitable attachment or bonding process. In one embodiment, the bump material is reflowed by heating the material above its melting point to form balls or bumps 592. In some applications, bumps 592 are reflowed a second time to improve electrical contact to conductive layers 584-588. Bumps 592 can also be compression bonded to conductive layers 584-588. Bumps 592 represent one type of interconnect structure that can be formed over conductive layers 584-588. The interconnect structure can also use stud bump, micro bump, or other electrical interconnect.

Figure 9D:
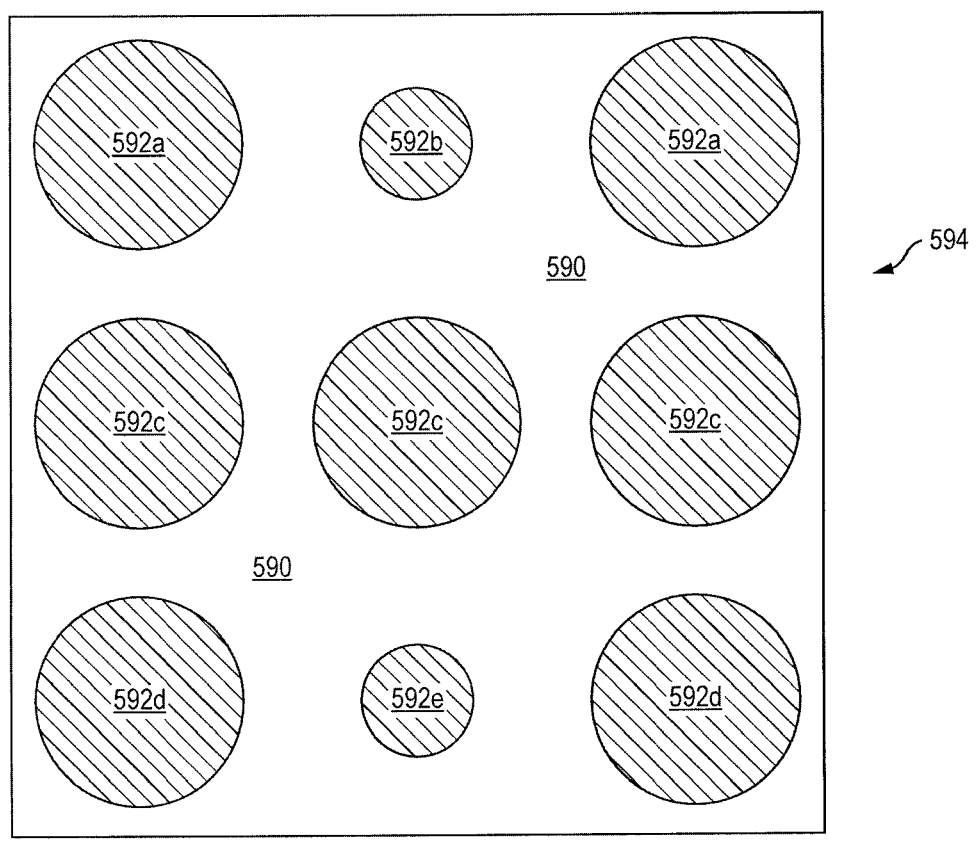

FIG. 9d shows a plan view of LGA semiconductor package 594 containing lateral power MOSFET 90 with bumps 592a as first drain terminals electrically connected to conductive layer 584, bump 592b as a first gate terminal electrically connected to conductive layer 587, bumps 592c as source terminals electrically connected to conductive layer 586, bumps 592d as second drain terminals electrically connected to conductive layer 588, and bump 592e as a second gate terminal electrically connected to conductive layer 589. The size of LGA semiconductor package 594 ranges from 0.5×0.5 mm to 3.0×3.0 mm. Power MOSFET 90 occupies a substantial portion of the LGA package footprint. Bumps 592a, 592c, and 592d are relatively large diameter 300 μm for lower contact resistance. In addition, the source metal 2 plane and drain metal 3 plane reduce resistance of interconnect structure 540 and accordingly the RDSON of power MOSFET 90.

Figure 10A:
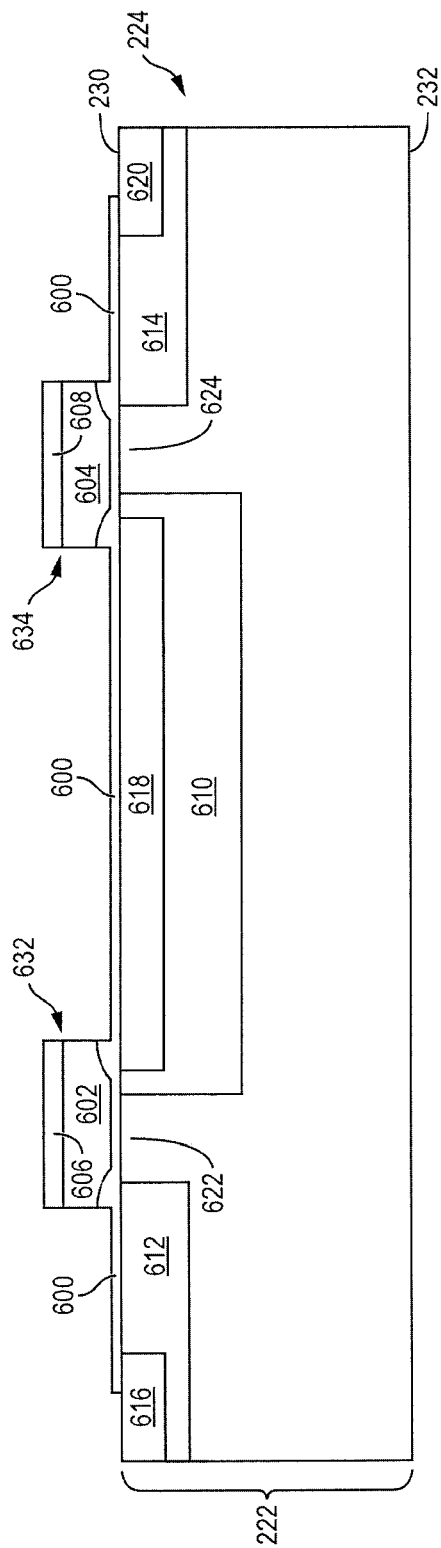
FIGS. 10a-10f illustrate a dual power MOSFET cell with field plates for lower resistance.

FIGS. 10a-10f illustrate, in relation to FIGS. 1-3, a process of forming dual power MOSFET cells with field plates for lower resistance. Continuing from FIG. 5a, substrate 222 includes an active surface 230 and back surface 232 that is opposite the active surface, as shown in FIG. 10a. For N-MOS devices, substrate 222 is initially doped with p-type semiconductor material, such as boron, aluminum, or gallium impurities. In one embodiment, the p-type dopant is deposited by ion implantation with dosage of 1E13 to 1E14 at hundreds of keV. Other implants can be deposited at appropriate dosages and energy levels. No mask is needed for the ion implantation.

An insulating or dielectric layer 600 is formed over surface 230 of substrate 222 as a gate oxide layer with a thickness of 100-1000 Å for the dual MOSFETs in semiconductor die 224. The insulating layer 600 contains one or more layers of SiO2, Si3N4, SiON, Ta2O5, Al2O3, polyimide, BCB, PBO, or other suitable dielectric material. The insulating layer 600 is formed using PVD, CVD, screen printing, spin coating, spray coating, sintering, or thermal oxidation. Polysilicon layers 602 and 604 are formed over insulating layer 600. A silicide layer 606 is formed over polysilicon layer 602, and silicide layer 608 is formed over polysilicon layer 604. After patterning polysilicon layer 604 and silicide layer 606, semiconductor wafer 120 is oxidized at 900° C. for 10 minutes to increase the thickness of insulating layer 600 around the edges of the gate structure.

Substrate 222 is doped with a higher concentration of p-type semiconductor material to form $p^+$-channel region 610 to a depth of 0.3 μm and extending to surface 230. Substrate 222 is further doped with n-type semiconductor material, such as arsenic or phosphorus, to form LDD regions 612 and 614. In one embodiment, the n-type dopant is deposited by ion implantation with dosage of 1E15 to 1E17 ppcm$^3$ at 10-50 keV. Other implants can be deposited at appropriate dosages and energy levels. The LDD regions 612 and 614 can be tuned by dopant levels to reduce punch through effects and control HCI and $BV_{DSS}$.

Substrate 222 is heavily doped with $n^+$-type semiconductor material, such as arsenic or phosphorus, to form N+ drain region 616 within LDD region 612, N+ source region 618 within p-channel region 610, and N+ drain region 620 within LDD region 614, each to a depth of 20 nm below surface 230. In one embodiment, the $n^+$-type dopant is deposited by ion implantation with dosage of 1E18 to 1E20 ppcm$^3$ at 10-50 KeV. Other implants can be deposited at appropriate dosages and energy levels. The area between LDD region 612 and N+ source region 618 is designated as n-channel 622, and the area between LDD region 614 and N+ source region 618 is designated as n-channel 624 for the dual MOSFETs in semiconductor die 224. P-channel region 610 extends partially across n-channel 622 and n-channel 624.

The width of p-channel region 610 across n-channel 622 and 624, as well as the doping concentration of the p-channel region, controls the threshold voltage of power MOSFET 90.

Figure 10B:
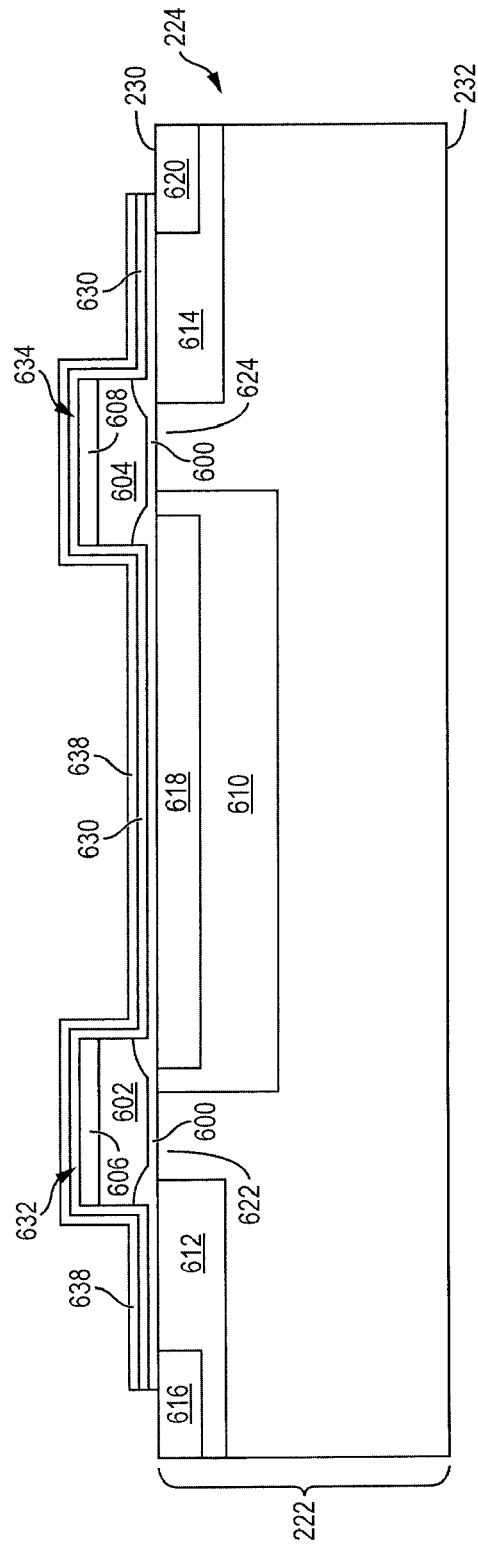

In FIG. 10b, an insulating layer 630 is formed over insulating layer 600 and gate structures 632 and 634. In one embodiment, insulating layer 630 includes tetraethyl-orthosilicate (TEOS) deposited using a high-temperature low-pressure deposition process, such as vapor deposition, with a thickness of 1000-1500 Å. An insulating layer 638 is formed over insulating layer 630 using PVD, CVD, screen printing, spin coating, spray coating, sintering, or thermal oxidation. The insulating layer 638 contains one or more layers of SiO2, Si3N4, SiON, Ta2O5, Al2O3, polyimide, BCB, PBO, or other suitable dielectric material with a thickness of 1000-1500 Å.

Figure 10C:
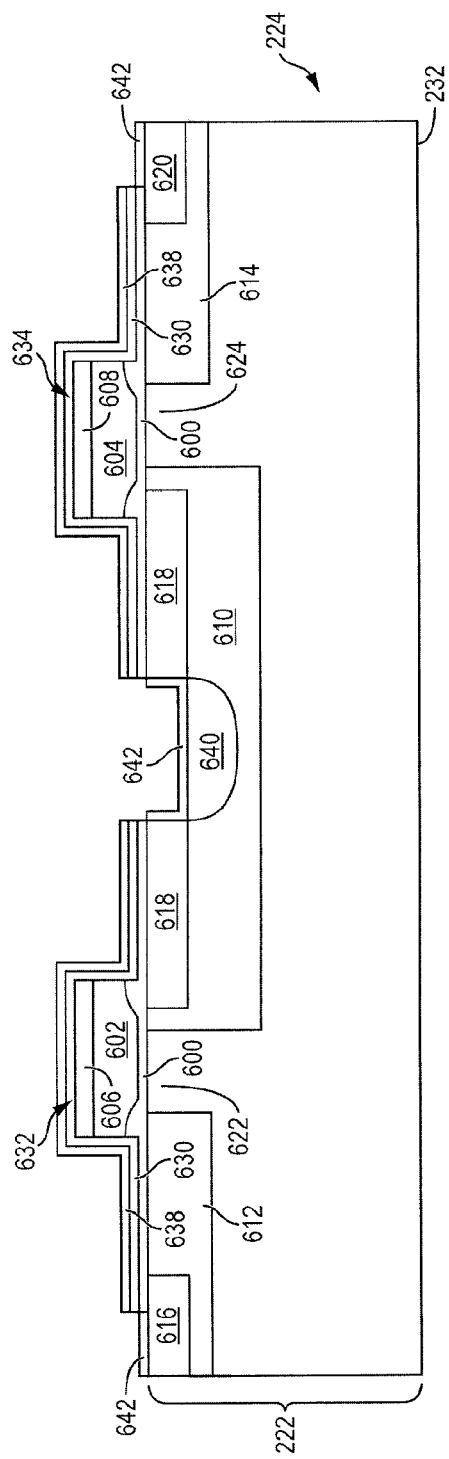

In FIG. 10c, a portion of substrate 222 is removed by a trench etching process using a photoresist layer in preparation for the source contact. Substrate 222 is heavily doped with $p^+$-type semiconductor material, such as boron, extending into p-channel region 610 to form P+ source contact 640. In one embodiment, the $p^+$-type dopant is deposited by ion implantation with dosage of 1E18 to 1E20 ppcm$^3$ at 10-50 KeV. Other implants can be deposited at appropriate dosages and energy levels.

A silicide layer 642 is formed over N+ drain region 616, P+ source contact 640, and N+ drain region 620. A source-drain anneal at 900° C. for 20 minutes diffuses the N+ regions 616 and 620 with LDD regions 612 and 614, respectively, and electrically activates the dopants within the regions. The N+ regions 616 and 620 have a low resistance ohmic contact for MOSFET cell 228.

Figure 10D:
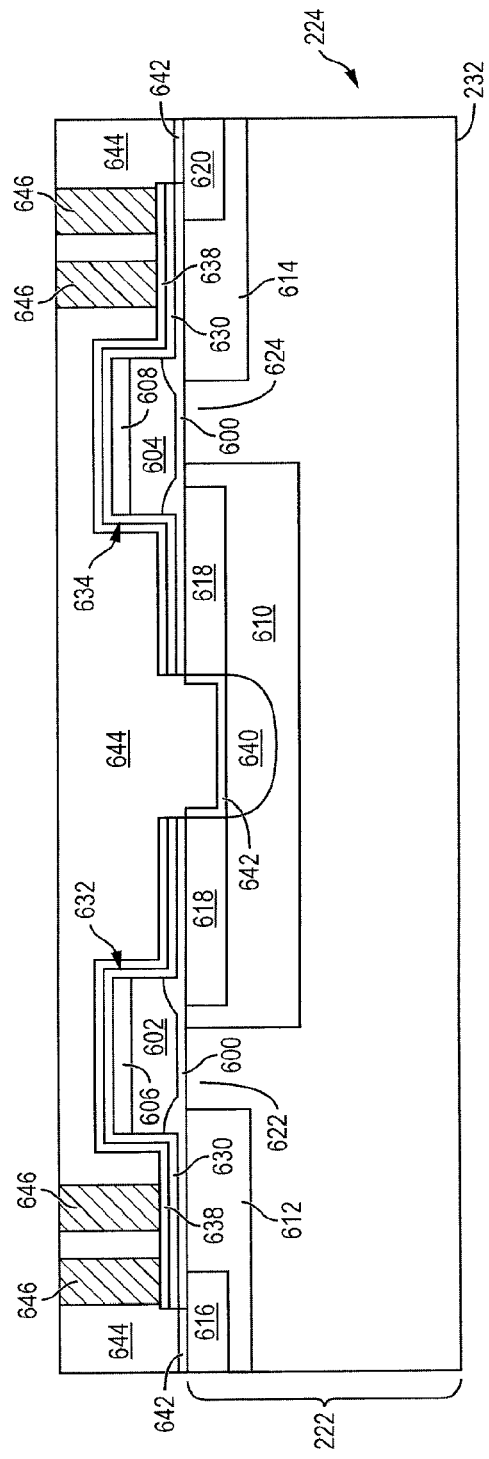

In FIG. 10d, an insulating layer 644 is formed over insulating layer 638 and silicide layer 642. In one embodiment, insulating layer 648 includes TEOS deposited using a high-temperature low-pressure deposition process, such as vapor deposition, with a thickness of 9000 Å over the portion of silicide layer 642 over N+ drain regions 616 and 620, 11500 Å over the portion of silicide layer 642 over P+ source contact 640, 3000 Å over the portion of insulating layer 638 over gate structures 632 and 634, and 7000 Å over the portion of insulating layer 638 over N+ source region 618. A plurality of channels is formed through insulating layer 644 over insulating layer 638 by etching, mechanical drilling, or laser drilling. The channels are filled with conductive material, such as W, Al, Cu, Sn, Ni, Au, Ag, or Ti, using electrolytic plating, electroless plating process, or other suitable deposition process to form conductive channels or field plates 646. Conductive field plates 646 extend the length of gate structures 632 and 634 across semiconductor die 224.

Figure 10E:
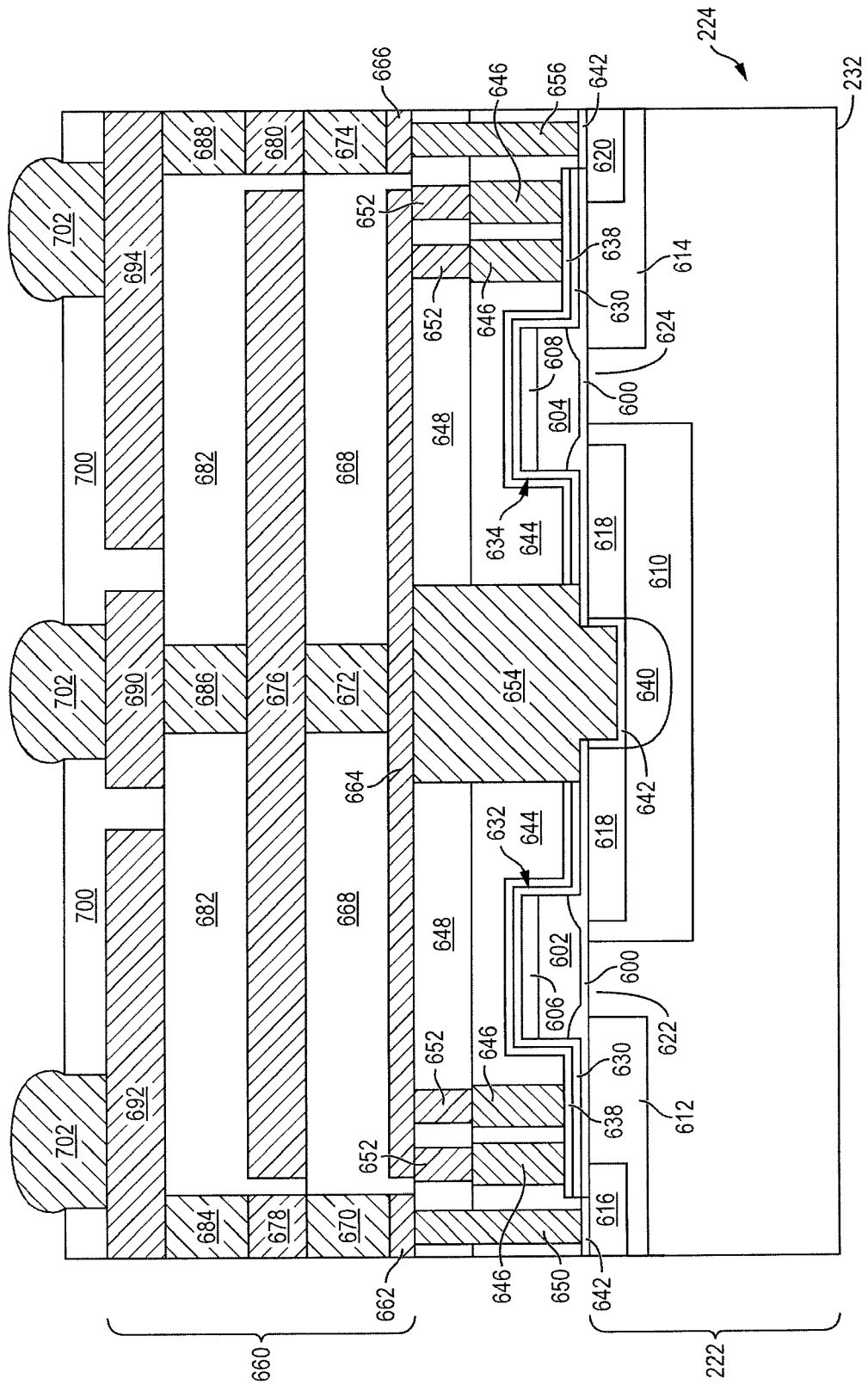

In FIG. 10e, an insulating layer 648 is formed over insulating layer 644 and conductive channels or field plates 646. In one embodiment, insulating layer 648 includes TEOS deposited using a high-temperature low-pressure deposition process, such as vapor deposition, with a thickness of 4000 Å. A plurality of vias is formed through insulating layers 644 and 648 over silicide layer 642 by etching, mechanical drilling, or laser drilling. The vias are filled with conductive material, such as W, Al, Cu, Sn, Ni, Au, Ag, or Ti, using electrolytic plating, electroless plating process, or other suitable deposition process to form drain contact 650, source contact 654, and drain contact 656. Drain contacts 650 and 656 are electrically connected to N+ drain regions 616 and 620, respectively. Source contact 654 is electrically connected to N+ source region 618. Drain contacts 650 and 656 are shown for completeness but can be disposed in a different vertical plane than source contact 654.

A plurality of vias or channels is formed through insulating layer 648 over conductive channels or field plates 646 by etching, mechanical drilling, or laser drilling. The channels are filled with conductive material, such as W, Al, Cu, Sn, Ni, Au, Ag, or Ti, using electrolytic plating, electroless plating process, or other suitable deposition process to form conductive channels or field plates 652. Conductive field plates 652 extend the length of gate structures 632 and 634 across semiconductor die 224. Conductive channels or field plates 652 are electrically connected to conductive channels or field plates 646.

In operation of MOSFET cell 228, a voltage is applied to gate structures 632 and 634 to create an electric field across channels 622 and 624. A current flows through source contact 654 and N+ source region 618 across channel 622 to N+ drain region 616 and drain contact 650. Likewise, a current flows through source contact 654 and N+ source region 618 across channel 624 to N+ drain region 620 and drain contact 656. In the dual MOSFET arrangement of semiconductor die 224, both drain currents merge into common source contact 654. A large number of MOSFET cells 228 are connected in parallel across substrate 222 to conduct a total current through lateral power MOSFET 90 in the range of 1-100 A with a voltage rating of 2-100 V. In one embodiment, semiconductor die 224 is a dual power MOSFET layout, similar to FIG. 5f.

An interconnect structure 660 is formed over MOSFET cells 228. The interconnect structure 660 includes a plurality of conductive layers, conductive vias, and insulating layers. In general, the conductive layers are patterned and deposited using electrolytic plating, electroless plating, sputtering, PVD, CVD, or other suitable metal deposition process. The conductive layers can be one or more layers of Cu, Sn, Ni, Au, Ag, Al, Ti, or other suitable conductive material. The insulating layers are formed using PVD, CVD, screen printing, spin coating, spray coating, sintering, or thermal oxidation. The insulating layers can be one or more layers of SiO2, Si3N4, SiON, Ta2O5, Al2O3, polyimide, BCB, PBO, or other suitable insulating material. A plurality of vias is formed through the insulating layers by etching, mechanical drilling, or laser drilling. The vias are filled with conductive material, such as W, Al, Cu, Sn, Ni, Au, Ag, or Ti, using electrolytic plating, electroless plating process, or other suitable deposition process to form the conductive vias.

More specifically, a conductive layer 662 is formed over drain contact 650 and insulating layer 648 as a drain metal 1 layer. A conductive layer 664 is formed over source contact 654, conductive channels or field plates 652, and insulating layer 648 as a source metal 1 layer. A conductive layer 666 is formed over drain contact 656 and insulating layer 648 as a drain metal 1 layer. Source metal 1 layer and drain metal 1 layers (conductive layers 662-666) are arranged in an alternating strip pattern, similar to FIG. 5h.

During operation of power MOSFET 90, the voltage present on conductive layer 664 and source contact 654 is routed to conductive channels or field plates 646 and 652. The voltage on conductive field plates 646 and 652 induces an electric field which acts to increase the breakdown voltage and reduce RDSON of power MOSFET 90.

An insulating layer 668 is formed over conductive layers 662-666 and insulating layer 648. A conductive via 670 is formed through insulating layer 668 and electrically connected to conductive layer 662. A conductive via 672 is formed through insulating layer 668 and electrically connected to conductive layer 664. A conductive via 674 is formed through insulating layer 668 and electrically connected to conductive layer 666. A conductive layer 676 is formed over insulating layer 668 and electrically connected to conductive via 672 as a source metal 2 layer. A conductive layer 678 is formed over insulating layer 668 and electrically connected to conductive via 670 as a drain metal 2 layer. A conductive layer 680 is formed over insulating layer 668 and electrically connected to conductive via 674 as a drain metal 2 layer.

Source metal 2 layer (conductive layer 676) is arranged in a plane structure across semiconductor die 224 to reduce resistance of interconnect structure 660 by distributing current density across the source metal plane, similar to FIG. 5i. Current flow is distributed omnidirectional across the source metal 2 plane to reduce the RDSON of power MOSFET 90. Drain metal 2 layers (conductive layers 678 and 680) are formed as islands within the source metal 2 plane, similar to FIG. 5i, for vertical interconnect of drain contacts 650 and 656 through the source metal 2 plane.

An insulating layer 682 is formed over conductive layers 676-680 and insulating layer 668. A conductive via 684 is formed through insulating layer 682 and electrically connected to conductive layer 678. A conductive via 686 is formed through insulating layer 682 and electrically connected to conductive layer 676. A conductive via 688 is formed through insulating layer 682 and electrically connected to conductive layer 680. A conductive layer 690 is formed over insulating layer 682 and electrically connected to conductive via 686 as a source metal 3 layer. A conductive layer 692 is formed over insulating layer 682 and electrically connected to conductive via 684 as a drain metal 3 layer. A conductive layer 694 is formed over insulating layer 682 and electrically connected to conductive via 688 as a drain metal 3 layer. Conductive vias 672 and 686 are shown for completeness but can be disposed in a different vertical plane than conductive vias 670, 674, 684, and 688.

Drain metal 3 layers (conductive layers 692 and 694) are arranged as plane structures across semiconductor die 224 to reduce resistance of interconnect structure 660 by distributing current density across the drain metal planes, similar to FIG. 5j. Current flow is distributed omnidirectional across the drain metal 3 planes to reduce the RDSON of power MOSFET 90. Source metal 3 layer is formed as circular islands within the drain metal 3 planes for vertical interconnect of source contact 654 through the drain metal 3 planes.

A passivation or insulating layer 700 is formed over conductive layers 690-694 and insulating layer 682. A portion of insulating layer 700 is removed by etching or LDA to expose conductive layers 690-694. An optional UBM layer is formed over the exposed portion of conductive layers 690-694, similar to conductive layer 332-334 in FIG. 5g.

An electrically conductive bump material is deposited over the exposed portion of conductive layers 690-694 using an evaporation, electrolytic plating, electroless plating, ball drop, stenciling, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 690-694 using a suitable attachment or bonding process. In one embodiment, the bump material is reflowed by heating the material above its melting point to form balls or bumps 702. In some applications, bumps 702 are reflowed a second time to improve electrical contact to conductive layers 690-694. Bumps 702 can also be compression bonded to conductive layers 690-694. Bumps 702 represent one type of interconnect structure that can be formed over conductive layers 690-694. The interconnect structure can also use stud bump, micro bump, or other electrical interconnect.

Figure 10F:
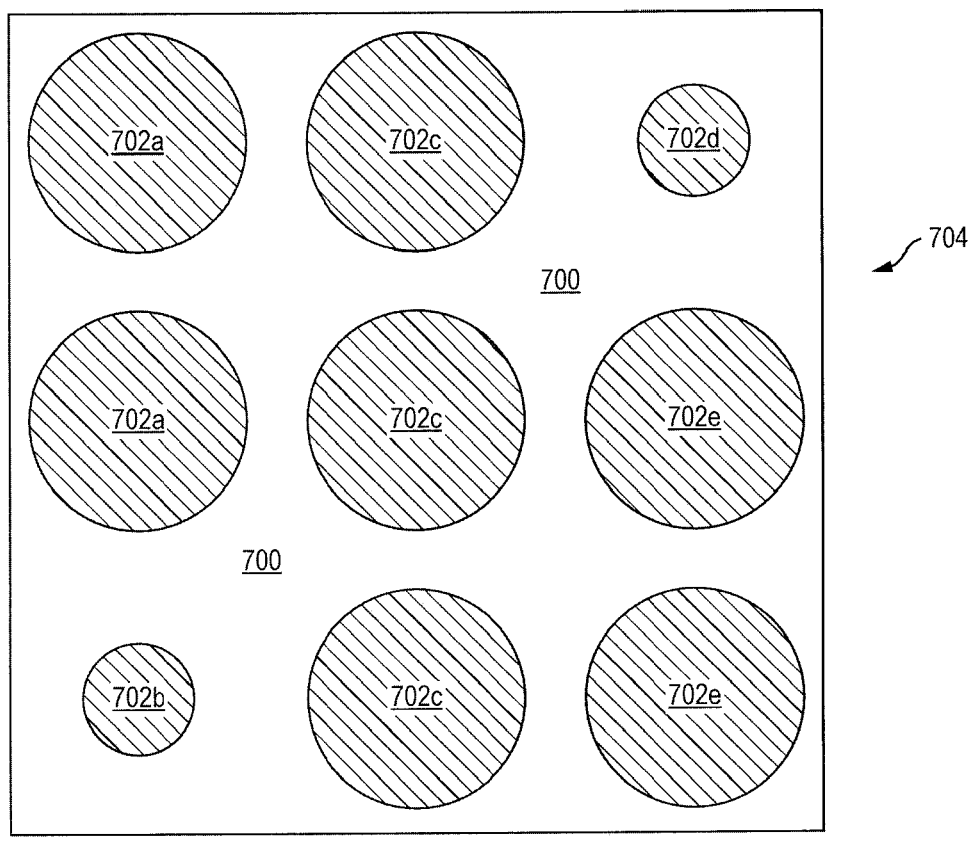

FIG. 10f shows a plan view of LGA semiconductor package 704 containing lateral power MOSFET 90 with bumps 702a as first drain terminals electrically connected to conductive layer 692, bump 702b as a first gate terminal, bumps 702c as source terminals electrically connected to conductive layer 690, bump 702d as a second gate terminal, and bumps 702e as second drain terminals electrically connected to conductive layer 690. The size of LGA package 704 ranges from 0.5×0.5 mm to 3.0×3.0 mm. Power MOSFET 90 occupies a substantial portion of the LGA package footprint. Bumps 702a, 702c, and 702e are relatively large diameter 300 μm for lower contact resistance. In addition, the source metal 2 plane reduces resistance of interconnect structure 660 and accordingly the RDSON of power MOSFET 90.

Figure 11:
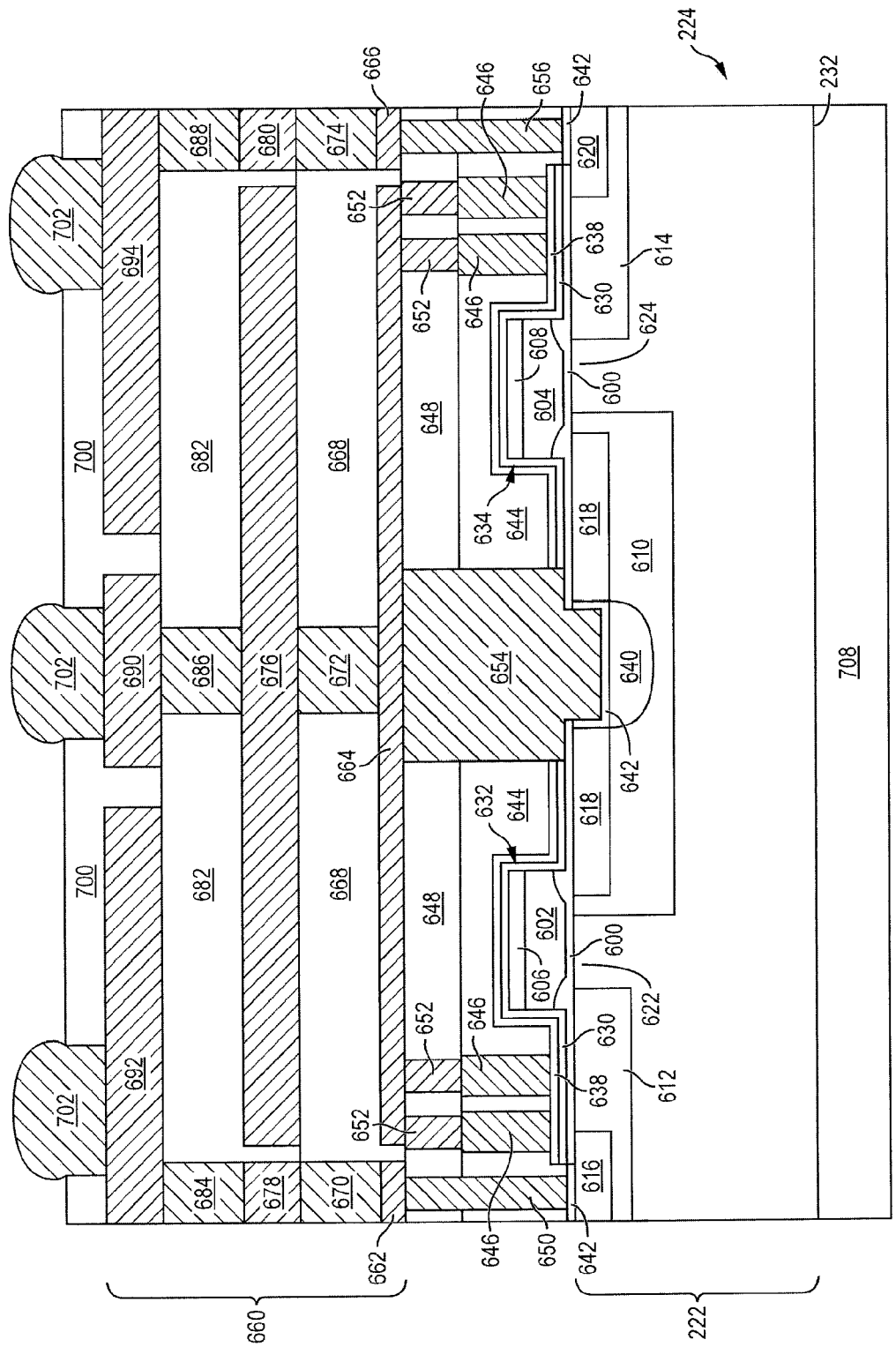
FIG. 11 illustrates a stress relief layer formed over a back surface of the substrate to compensate for the stress induced by the interconnect structure.

FIG. 11 shows an embodiment, similar to FIG. 10e, with a stress relief film 708 formed on back surface 232 of substrate 222. Stress relief film 708 neutralizes wafer bowing and warping induced by the thick conductive layers of interconnect structure 660.

Figure 12:
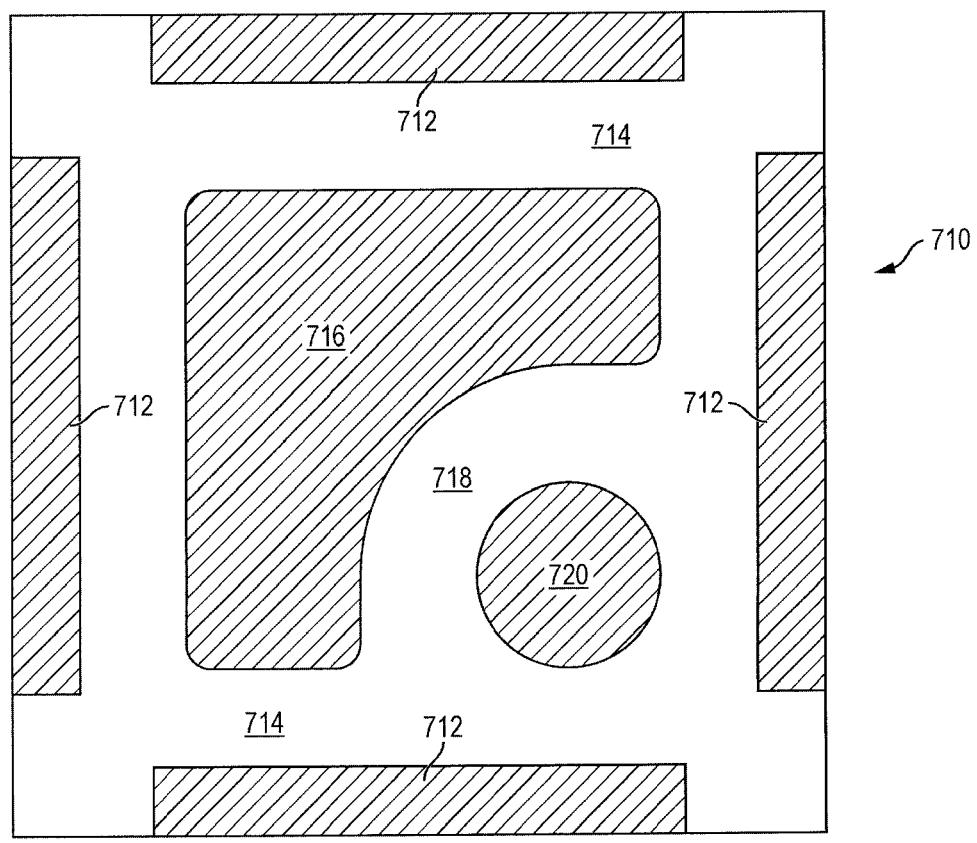
FIG. 12 illustrates an alternate metal layer for the interconnect structure.

FIG. 12 shows a plan view of LGA semiconductor package 710 containing lateral power MOSFET 90, similar to FIGS. 4a-4f, 5a-5i, 6a-6b, 7a-7b, 9a-9b, and 10a-10e, with source metal 3 or 4 layer 712 formed over insulating layer 714 and arranged around a perimeter of the semiconductor package. Drain metal 3 or 4 layer 716 is formed over insulating layer 714 within an interior region of semiconductor package 710 and surrounded by source metal 3 or 4 layer 712. In particular, drain metal 3 or 4 layer 716 is formed to provide area 718 designated for formation of a gate pad. A conductive layer 720 is formed within area 718 as a gate pad electrically connected to the gate structure on semiconductor die 224.

While one or more embodiments of the present invention have been illustrated in detail, the skilled artisan will appreciate that modifications and adaptations to those embodiments may be made without departing from the scope of the present invention as set forth in the following claims.

The invention claimed is:
1. A method of making a semiconductor device, comprising:
providing a substrate;
forming a gate structure over the substrate;
forming a source region in the substrate adjacent to the gate structure;
forming a drain region in the substrate adjacent to the gate structure opposite the source region; and
forming an interconnect structure over the substrate by,
(a) forming a first conductive plane electrically connected to the source region,
(b) forming a first conductive layer within an opening of the first conductive plane and electrically connected to the drain region, wherein a first gap surrounds the first conductive layer and separates the first conductive plane from the first conductive layer such that the first conductive plane surrounds but does not contact the first conductive layer,
(c) forming a second conductive plane electrically connected to the drain region, and
(d) forming a second conductive layer within an opening of the second conductive plane and electrically con- nected to the source region, wherein a second gap separates the second conductive plane from the second conductive layer.

2. The method of claim 1, further including:
forming a gate terminal over the interconnect structure electrically connected to the gate structure;
forming a source terminal over the interconnect structure electrically connected to the source region through the first conductive plane and second conductive layer; and
forming a drain terminal over the interconnect structure electrically connected to the drain region through the second conductive plane and first conductive layer.

3. The method of claim 1, further including:
forming a first lightly doped region adjacent to the source region; and
forming a second lightly doped region adjacent to the drain region.

4. The method of claim 1, further including forming a portion of the second conductive plane within a footprint of the first conductive plane.

5. The method of claim 1, further including:
forming a first conductive via coupled between the first conductive plane and second conductive layer; and
forming a second conductive via coupled between the second conductive plane and first conductive layer.

6. The method of claim 1, further including:
forming a portion of the first conductive plane within a footprint of the gate structure; and
forming a portion of the second conductive plane within a footprint of the gate structure.

7. A method of making a semiconductor device, comprising:
providing a substrate;
forming a first gate structure over the substrate;
forming a source region in the substrate adjacent to the first gate structure;
forming a first drain region in the substrate adjacent to the first gate structure opposite the source region; and
forming an interconnect structure over the substrate by,
(a) forming a conductive plane comprising a conductive material and electrically connected to the source region, and
(b) forming a first conductive layer within an opening of the conductive material of the conductive plane and electrically connected to the first drain region, wherein a gap surrounds the first conductive layer between the first conductive layer and conductive plane such that the conductive plane surrounds but does not contact the first conductive layer.

8. The method of claim 7, further including:
forming a gate terminal over the interconnect structure electrically connected to the first gate structure;
forming a source terminal over the interconnect structure electrically connected to the source region through the conductive plane; and
forming a drain terminal over the interconnect structure electrically connected to the first drain region through the first conductive layer.

9. The method of claim 8, wherein the conductive plane extends under the gate terminal.

10. The method of claim 7, further including:
forming a second gate structure over the substrate; and
forming a second drain region in the substrate adjacent to the second gate structure opposite the source region.

11. The method of claim 7, further including:
forming a first lightly doped region adjacent to the source region; and
forming a second lightly doped region adjacent to the first drain region.

12. The method of claim 7, further including:
forming an insulating layer over the substrate;
forming a field plate in the insulating layer; and
forming a second conductive layer formed over the insulating layer and field plate to electrically connect the conductive plane to the field plate.

13. The method of claim 7, further including forming a stress relief layer over a surface of the substrate opposite the gate structure.

14. A method of making a semiconductor device, comprising:
providing a substrate;
forming a first transistor on the substrate, the first transistor including a first control terminal, first conduction terminal, and second conduction terminal;
forming a first conductive plane over the substrate and coupled to the first conduction terminal;
forming a second conductive plane over the first conductive plane; and
forming a conductive via coupled between the second conduction terminal and second conductive plane through an opening in the first conductive plane, wherein the opening surrounds the conductive via such that the conductive via is separated from and does not touch the first conductive plane.

15. The method of claim 14, further including forming an interconnect terminal over the first conductive plane electrically connected to the second conduction terminal of the first transistor through the second conductive plane.

16. The method of claim 15, wherein the first conductive plane extends under the interconnect terminal.

17. The method of claim 14, further including forming a second transistor on the substrate, the second transistor including a second control terminal, the first conduction terminal, and a third conduction terminal adjacent to the second control terminal opposite the first conduction terminal.

18. The method of claim 14, further including:
forming an insulating layer over the substrate;
forming a field plate in the insulating layer; and
forming a conductive layer over the insulating layer to electrically connect the first conduction terminal to the field plate.

19. The method of claim 14, further including forming a stress relief layer over a surface of the substrate opposite the first control terminal.

20. A semiconductor device, comprising:
a substrate;
a first transistor formed on the substrate, the first transistor including a first control terminal, first conduction terminal, and second conduction terminal;
a conductive plane formed over the substrate and coupled to the first conduction terminal; and
a first conductive layer formed within an opening of the conductive plane and coupled to the second conduction terminal, wherein a gap surrounds the first conductive layer and separates the conductive plane from the first conductive layer such that first conductive layer is completely surrounded by the conductive plane but does not physically contact the conductive plane.

21. The semiconductor device of claim 20, further including an interconnect terminal electrically connected to the first conduction terminal of the first transistor through the conductive plane.

22. The semiconductor device of claim 21, wherein the conductive plane extends under the interconnect terminal.

23. The semiconductor device of claim 20, further including a second transistor formed on the substrate, the second transistor including a second control terminal, the first conduction terminal, and a third conduction terminal adjacent to the second control terminal opposite the first conduction terminal.

24. The semiconductor device of claim 20, further including:
   an insulating layer formed over the substrate;
   a field plate formed in the insulating layer; and
   a second conductive layer formed over the insulating layer to couple the first conduction terminal to the field plate.

25. The semiconductor device of claim 20, further including a stress relief layer formed over a surface of the substrate opposite the first control terminal.

* * * * *

UNITED STATES PATENT AND TRADEMARK OFFICE
CERTIFICATE OF CORRECTION

PATENT NO. : 9,640,638 B2  
APPLICATION NO. : 13/746826  
DATED : May 2, 2017  
INVENTOR(S) : Anderson et al.

Page 1 of 1

It is certified that error appears in the above-identified patent and that said Letters Patent is hereby corrected as shown below:

On the Title Page

In Item (57), under "ABSTRACT", in Column 2, Line 14, delete "connected the" and insert -- connected to the --, therefor.

In the Specification

In Column 1, Line 12, delete "2009," and insert -- 2009, now Pat. No. 8,921,186, --, therefor.

In Column 5, Line 31, delete "polyisopremes." and insert -- polyisoprene. --, therefor.

In Column 5, Line 45, delete "novolak" and insert -- novolac --, therefor.

In Column 9, Line 37, delete "lightly doped (LDD)" and insert -- lightly doped drain (LDD) --, therefor.

In Column 13, Line 22, delete "silicide layer 244," and insert -- silicide layer 246, --, therefor.

Signed and Sealed this  
Twenty-eighth Day of November, 2017

Joseph Matal  
*Performing the Functions and Duties of the*  
*Under Secretary of Commerce for Intellectual Property and*  
*Director of the United States Patent and Trademark Office*